(12) United States Patent
Khasawneh et al.

(10) Patent No.: US 11,094,370 B2
(45) Date of Patent: Aug. 17, 2021

(54) ENHANCED AUTO-PRECHARGE MEMORY SCHEDULING POLICY

(71) Applicant: Intel Corporation, Santa Clara, CA (US)

(72) Inventors: Shadi T. Khasawneh, Austin, TX (US); Mukund Ramakrishna, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/728,679

(22) Filed: Dec. 27, 2019

(65) Prior Publication Data

US 2021/0201984 A1    Jul. 1, 2021

(51) Int. Cl.
| | |
|---|---|
| G06F 13/28 | (2006.01) |
| G11C 11/4094 | (2006.01) |
| G11C 11/4076 | (2006.01) |
| G11C 11/4093 | (2006.01) |
| G06F 12/12 | (2016.01) |
| G11C 11/4091 | (2006.01) |
| G11C 11/408 | (2006.01) |
| G11C 13/00 | (2006.01) |

(52) U.S. Cl.
CPC ......... *G11C 11/4094* (2013.01); *G06F 12/12* (2013.01); *G11C 11/4076* (2013.01); *G11C 11/4091* (2013.01); *G11C 11/4093* (2013.01); *G11C 11/4087* (2013.01); *G11C 13/0004* (2013.01)

(58) Field of Classification Search
CPC ............ G11C 11/4094; G11C 11/4076; G11C 11/4091; G11C 11/4078; G11C 13/0004; G06F 12/12
USPC ........................................................ 711/106
See application file for complete search history.

(56) References Cited

U.S. PATENT DOCUMENTS

| | | | |
|---|---|---|---|
| 5,745,913 A * | 4/1998 | Pattin .................. | G06F 12/0215 |
| | | | 711/105 |
| 2012/0317376 A1* | 12/2012 | Loh ..................... | G06F 13/1663 |
| | | | 711/154 |

* cited by examiner

*Primary Examiner* — Huan Hoang
(74) *Attorney, Agent, or Firm* — Nicholson De Vos Webster & Elliott, LLP

(57) ABSTRACT

Disclosed embodiments relate to enhanced auto-precharge memory scheduling. In one example, a system includes a memory having a matrix of storage cells, which, responsive to a row address strobe (RAS) signal, activates a given row, responsive to a column address strobe (CAS) signal, selects storage cells in the given row, and, responsive to a combined auto-precharge (AP) and CAS signal, accesses, then closes the given row. A memory controller selects a memory request from a memory request queue, generates the RAS signal to activate a row, when another memory request to the row is enqueued, generates the CAS signal to select a storage cell, when another memory request to a same bank but a different row is enqueued, generates the combined AP and CAS signal, and, when no memory request to the same bank is enqueued, generates the CAS signal only, allowing a close timer to close the row.

19 Claims, 20 Drawing Sheets

500

```
for each pending request in the memory controller {
    If this is the last request enqueued to a page {
            if there is at least one request to the same bank/diff page (1) {
                    send CAS w/AP
            } else {
                    send CAS
                    defer to page close timer to decide when to close the page
            }
    else {
            send CAS only
    }
```

FIG. 5

1) Fill Rate
2) dx11/3dmark11v1132 GT1
3) dx11/3dmark-v2-3-3663
4) dx11batman-a0
5) dx11/battlefield1 G3
6) x11/star-wars-battlefront-2
7) dx11/vrmark1-0-1227
8) Stream DOT
9) Stream Copy
10) Memset
11) ogl/svp-12
12) ogl/unigine-valley
13) Texture copy rate
14) spmv_a_cache full tile
15) spmv_a_no_cache full tile
16) spmv_a_cache
17) spmv_a_no_cache
18) triad_dp
19) triad_int
20) triad_sp
21) triad_sp4

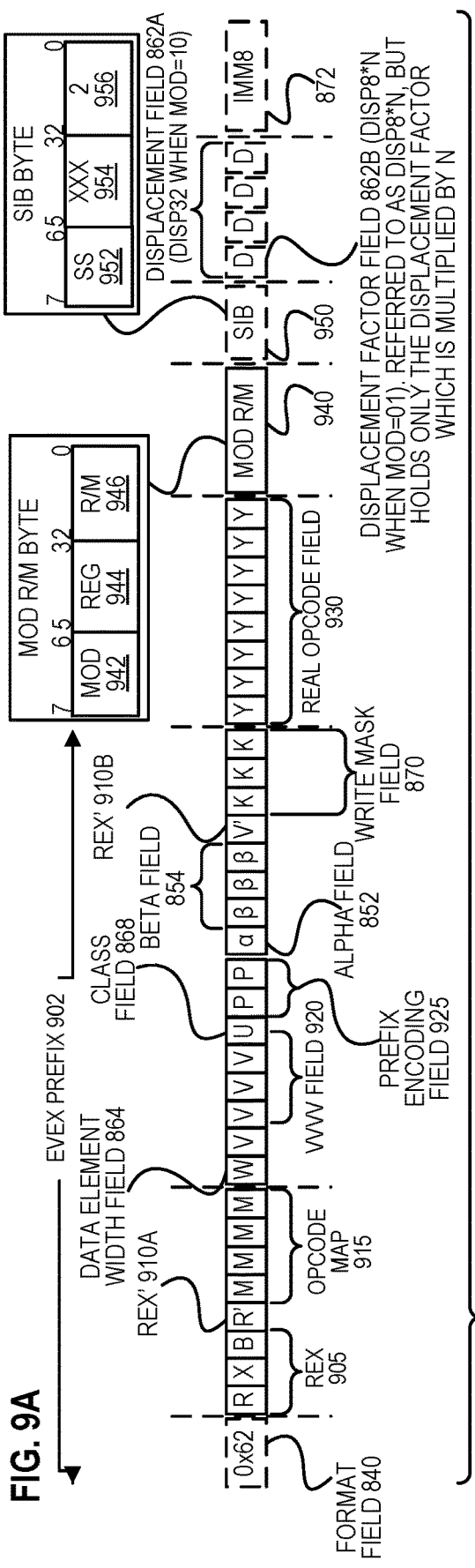
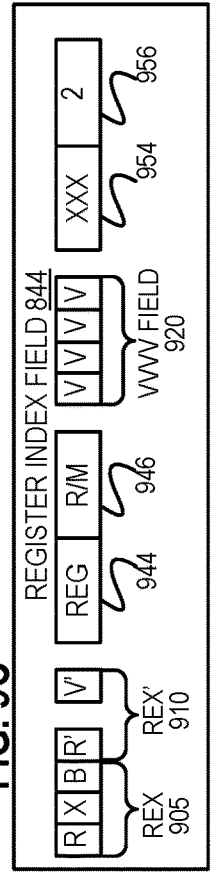
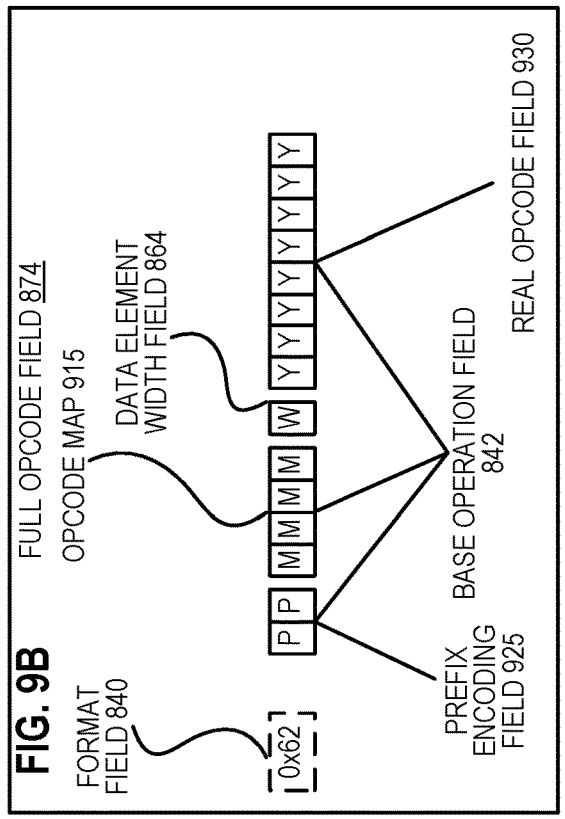
FIG. 9A
FIG. 9B
FIG. 9C

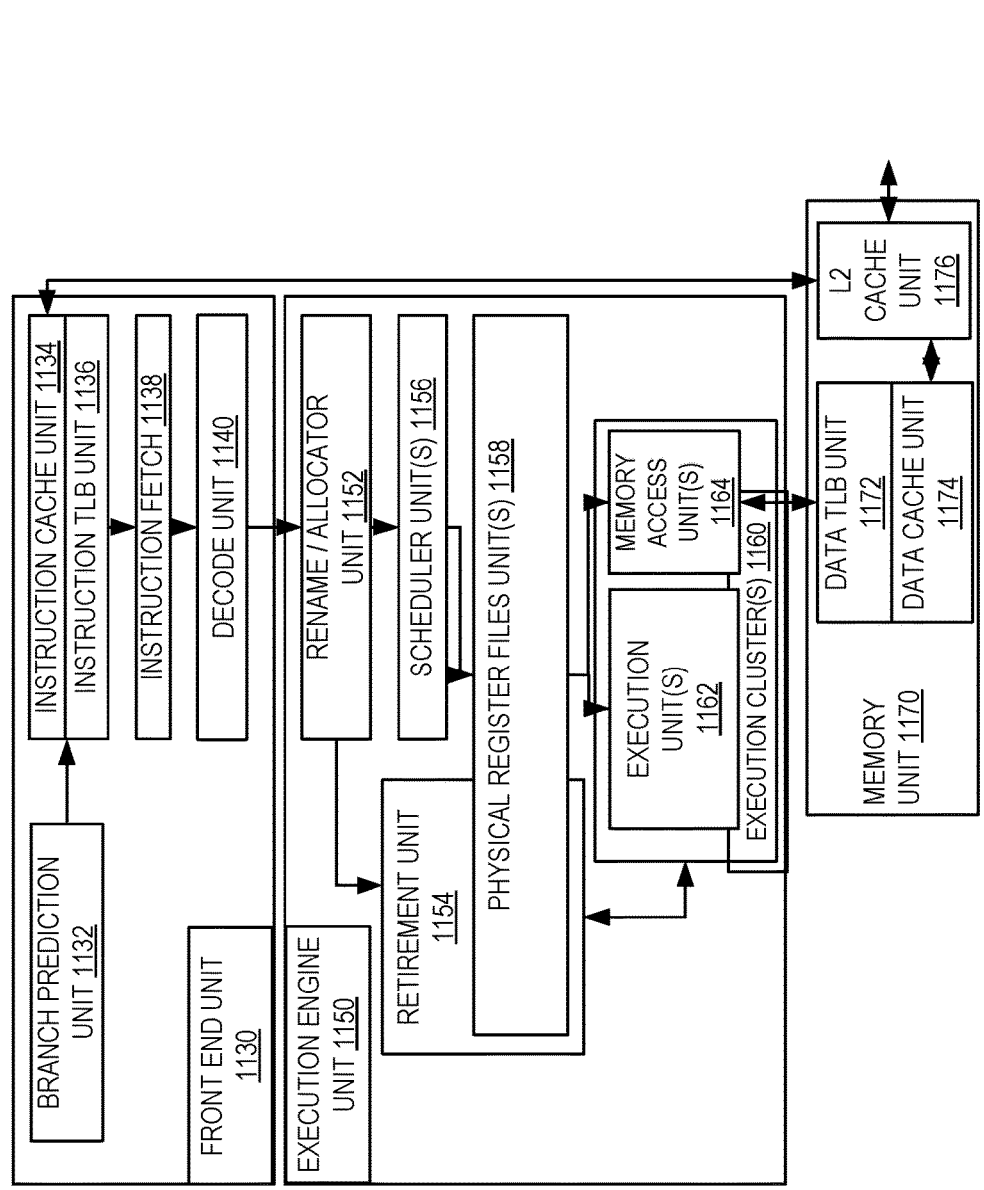
FIG. 11A
FIG. 11B

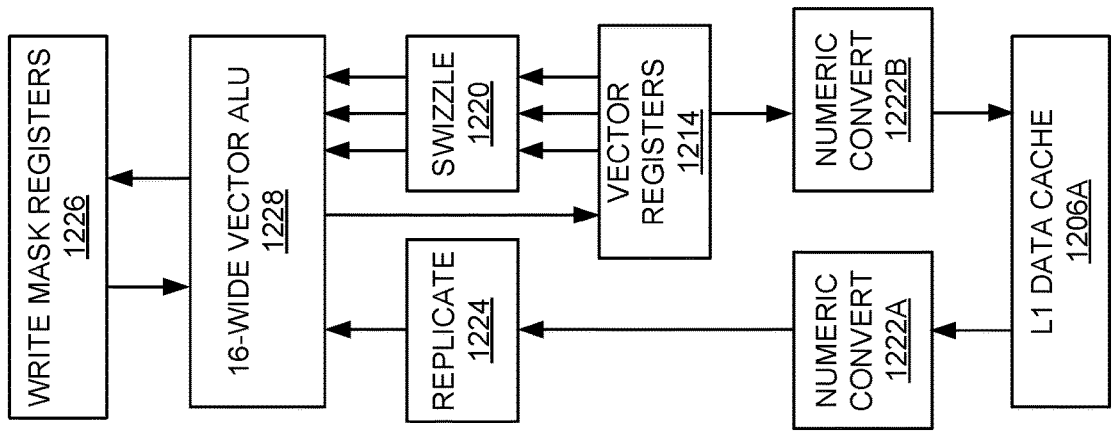
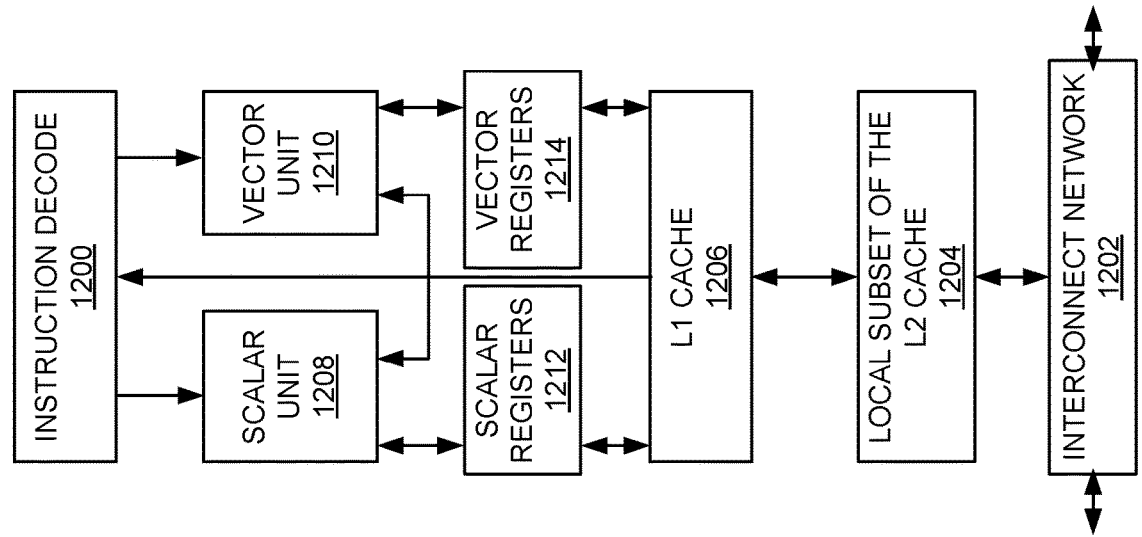

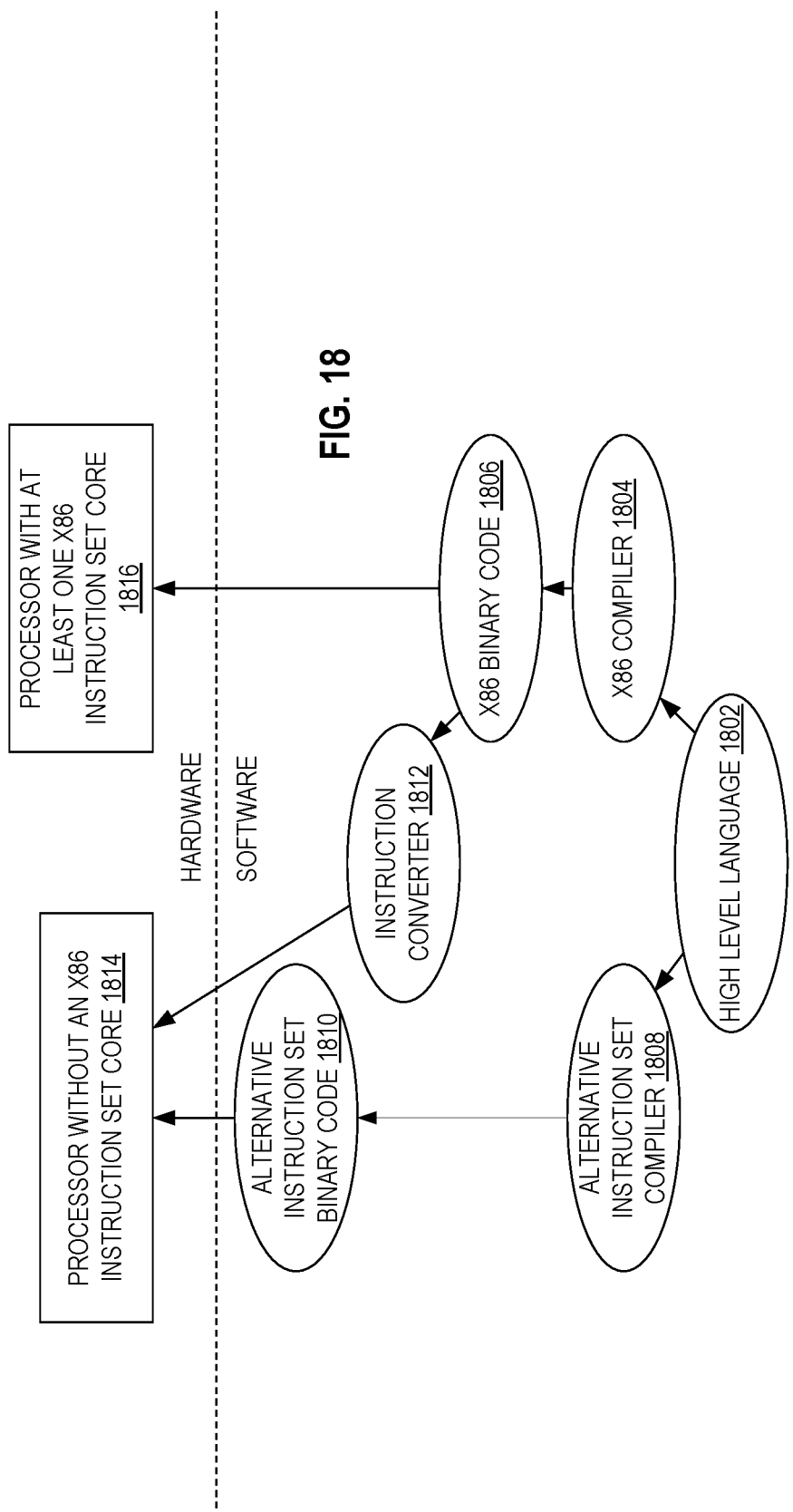

ENHANCED AUTO-PRECHARGE MEMORY SCHEDULING POLICY

FIELD OF THE INVENTION

The field of invention relates generally to computer processor architecture, and, more specifically, to an enhanced auto-precharge memory scheduling policy.

BACKGROUND

Computing systems generally rely on memory devices to store information. One common type of volatile memory device is Dynamic Random Access Memory (DRAM). DRAM devices generally store each bit of data in a separate capacitor within an integrated circuit. Since capacitors leak charge, the information eventually fades unless the capacitor charge is refreshed periodically. Because of this refresh requirement and other design considerations, DRAM designers impose various timing constraints on operations within a DRAM to maintain correctness. One such constraint is a precharge requirement.

In particular, when access is requested to a different page (sometimes referred to herein as a row or a Bit Line (BL)) in a DRAM, the current row must first be deactivated by issuing a "precharge" command. The precharge command will cause the sense amplifiers to switch off and the bit lines to be precharged.

The AP (auto-precharge) option for READ and WRITE memory accesses allows for a fast, automatic PRECHARGE command after the READ/WRITE. DRAM command bandwidth can be reduced by combining the Read or Write CAS (column address strobe) with the Precharge closing the page. Some memory controllers immediately close the row on the last request to the row by combining the last CAS with the Precharge. In other words, such memory controllers send a CAS_AP for the last request to the row. Unfortunately, sending a CAS_AP with every last request is vulnerable to glass jaws when a row is closed sooner than it should be, prematurely (as used herein, a glass jaw is a significant latency or delay that can arise as an unexpected outcome of an architectural feature and degrade performance.).

BRIEF DESCRIPTION OF THE DRAWINGS

The present invention is illustrated by way of example and not limitation in the figures of the accompanying drawings, in which like references indicate similar elements and in which:

FIG. 5 is pseudocode illustrating an embodiment of scheduling memory requests;

FIG. 8A is a block diagram illustrating a generic vector friendly instruction format and class A instruction templates thereof according to some embodiments of the invention;

FIG. 8B is a block diagram illustrating the generic vector friendly instruction format and class B instruction templates thereof according to some embodiments of the invention;

FIG. 9A is a block diagram illustrating an exemplary specific vector friendly instruction format according to some embodiments of the invention;

FIG. 9B is a block diagram illustrating the fields of the specific vector friendly instruction format that make up the full opcode field according to one embodiment;

FIG. 9C is a block diagram illustrating the fields of the specific vector friendly instruction format that make up the register index field according to one embodiment;

FIG. 11A is a block diagram illustrating both an exemplary in-order pipeline and an exemplary register renaming, out-of-order issue/execution pipeline according to some embodiments;

FIG. 11B is a block diagram illustrating both an exemplary embodiment of an in-order architecture core and an exemplary register renaming, out-of-order issue/execution architecture core to be included in a processor according to some embodiments;

FIGS. 12A-B illustrate a block diagram of a more specific exemplary in-order core architecture, which core would be one of several logic blocks (including other cores of the same type and/or different types) in a chip;

FIG. 12A is a block diagram of a single processor core, along with its connection to the on-die interconnect network and with its local subset of the Level 2 (L2) cache, according to some embodiments;

FIG. 12B is an expanded view of part of the processor core in FIG. 12A according to some embodiments;

FIG. 14 shown a block diagram of a system in accordance with some embodiments;

FIG. 15 is a block diagram of a first more specific exemplary system in accordance with some embodiment;

FIG. 16 is a block diagram of a second more specific exemplary system in accordance with some embodiments;

FIG. 17 is a block diagram of a System-on-a-Chip (SoC) in accordance with some embodiments; and FIG. 18 is a block diagram contrasting the use of a software instruction converter to convert binary instructions in a source instruction set to binary instructions in a target instruction set according to some embodiments.

DETAILED DESCRIPTION OF THE EMBODIMENTS

Figure 1:
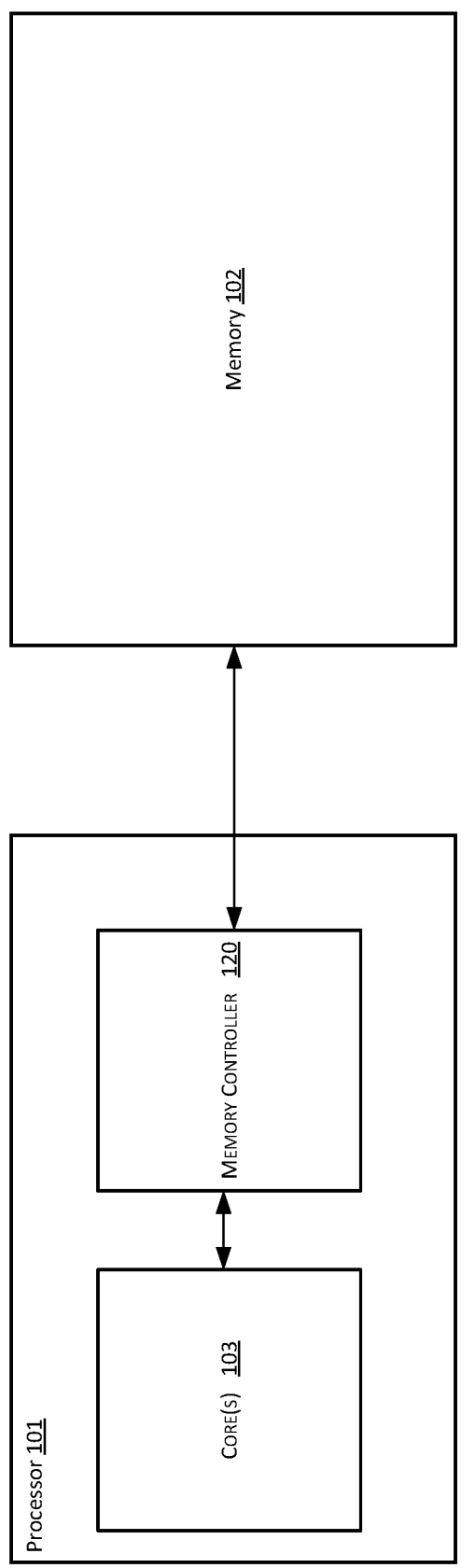
FIG. 1 is a block diagram illustrating processing components for executing instructions, according to some embodiments.

In the following description, numerous specific details are set forth. However, it is understood that some embodiments may be practiced without these specific details. In other instances, well-known circuits, structures, and techniques have not been shown in detail in order not to obscure the understanding of this description.

References in the specification to "one embodiment," "an embodiment," "an example embodiment," etc., indicate that the embodiment described may include a feature, structure, or characteristic, but every embodiment may not necessarily include the feature, structure, or characteristic. Moreover, such phrases are not necessarily referring to the same embodiment. Further, when a feature, structure, or characteristic is described about an embodiment, it is submitted that it is within the knowledge of one skilled in the art to affect such feature, structure, or characteristic about other embodiments if explicitly described.

As mentioned above, a policy of sending a CAS_AP with every last request to a row is vulnerable to glass jaws when a row is closed sooner than it should be, i.e., prematurely. Some memory controllers adhering to such a policy build a LL (linked list) holding requests to a given row, and issue the combined CAS_AP on the very last DRAM request to the given row. However, in the case of the anomalous scenario in which the next request arriving happens to be to the same memory row, \closing the row will cause a power and performance loss, as the new request will need to reopen the same page again.

Embodiments of the disclosed invention described an enhanced auto-precharge (eAP) technology, which sends combined CAS_AP when the MC (Memory Controller) has enqueued other requests/LLs to the same bank (different page). However, if the last request to the page is the only remaining enqueued request to that bank, the memory controller, instead of issuing a CAS_AP, only issues the CAS and defers to or relies on a page close policy to handle closing the page. The eAP technology can be used with different embodiments of a page close policy. For example, a page close timer can be relied upon to close the page when no new requests to the same page arrive within a threshold amount of time. As a further example, an adaptive page close timer with dynamically adjustable timer and thresholds can be used. Even an open page policy can be used, by which the page is to be kept open. Advantageously, rather than to immediately close a page, the page close policy can be selected to does not immediately close the page: the page may be left open until another request to the same page arrives.

Advantageously, eAP avoids many glass jaws (e.g., a scenario that arises as an unexpected outcome of an architectural feature and causes a degradation in performance) that come about due to gaps between requests. Some embodiments gain further advantage by using, as the page close policy, an adaptive page close timer whose threshold amount of time is dynamically adjusted to tolerate gaps between subsequent memory access requests. The threshold amount of time can be adjusted for any of several reasons, including but not limited to the a change in the topology being used in the system, the frequency and volume of memory access requests, the number of cores accessing the memory, and the number of memory channels being used, as well as the hashing being used to select a channel for each memory access request. Having more memory channels will typically increase the percentage of cases of seeing gaps between memory access requests, and can enhance the performance gains afforded by eAP.

FIG. 1 illustrates embodiments of a computing system. In particular, a processor 101 is coupled to memory 102. One or more cores 103 of the processor 101 utilized a memory controller 120 to access the memory 102. Aspects of the memory controller 120 are detailed below. In particular, an enhanced auto-precharge (eAP) technique is used by the memory controller 120, which sends a combined CAS_AP when the memory controller 120 has enqueued other requests to the same bank (different page).

Figure 2:
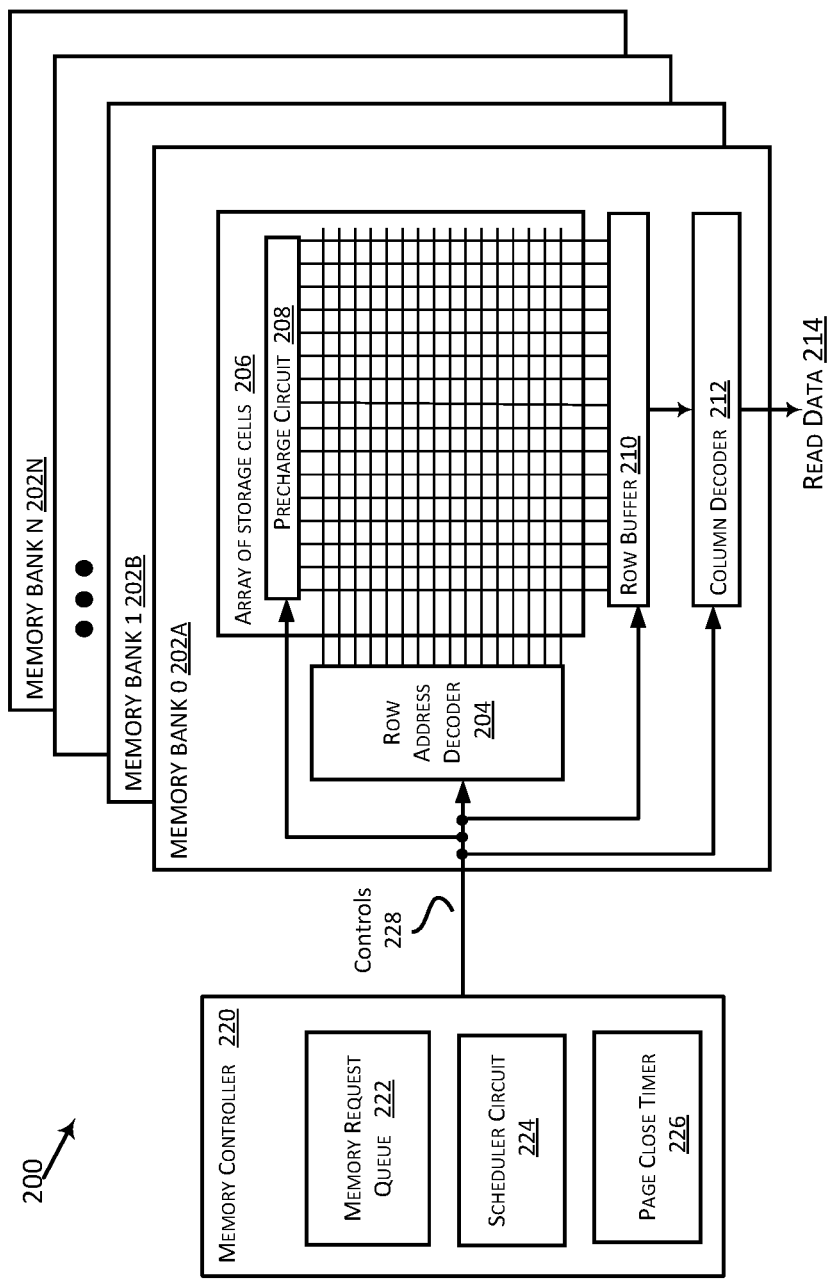
FIG. 2 illustrates a memory, according to some embodiments.

FIG. 2 illustrates a memory, according to some embodiments. As shown, memory system 200 includes N memory banks, 202A, 202B, up to 202N. Memory bank 0 202A is shown including several components: a row address decoder 204, an array of storage cells 206, a precharge circuit 208, a row buffer 210, and a column decoder 212. The remaining memory banks 202B through 202N also include those several components. The memory banks together provide read data 214 in response to memory read requests and write data in response to memory write requests.

Also shown is memory controller (MC) 220, which includes memory request queue 222, scheduler circuit 224, and page close timer 226. It should be noted that page close timer 226 is but one example of a page close policy that can be used to close the page when eAP technology is used. Memory controller 220 generates and provides controls 228 to the memory banks. Controls 228 include at least a precharge, CAS, RAS, and combined CAS_AP signals, as well as memory address and write data.

In operation, according to some embodiments, MC 220 selects a memory request from memory request queue 222, and activates a selected row by generating the RAS signal, CAS signal, and the memory address. In the case of a write request, MC 220 also generates the write data. When another memory request to the selected row is enqueued, MC 220 generates the CAS signal to select a storage cell in the selected row. Otherwise, when another memory request to a same bank but a different row than the selected row is enqueued, MC 220 generates the combined AP and CAS signal. Otherwise, when no further requests to the same bank are enqueued, MC 220 generates the CAS signal only and defers to the page close policy (e.g., page close timer) to close the activated row. Operation of the enhanced auto-precharge memory scheduling policy is further described and illustrated with respect to FIGS. 3-6 and 11A-B.

Figure 3:
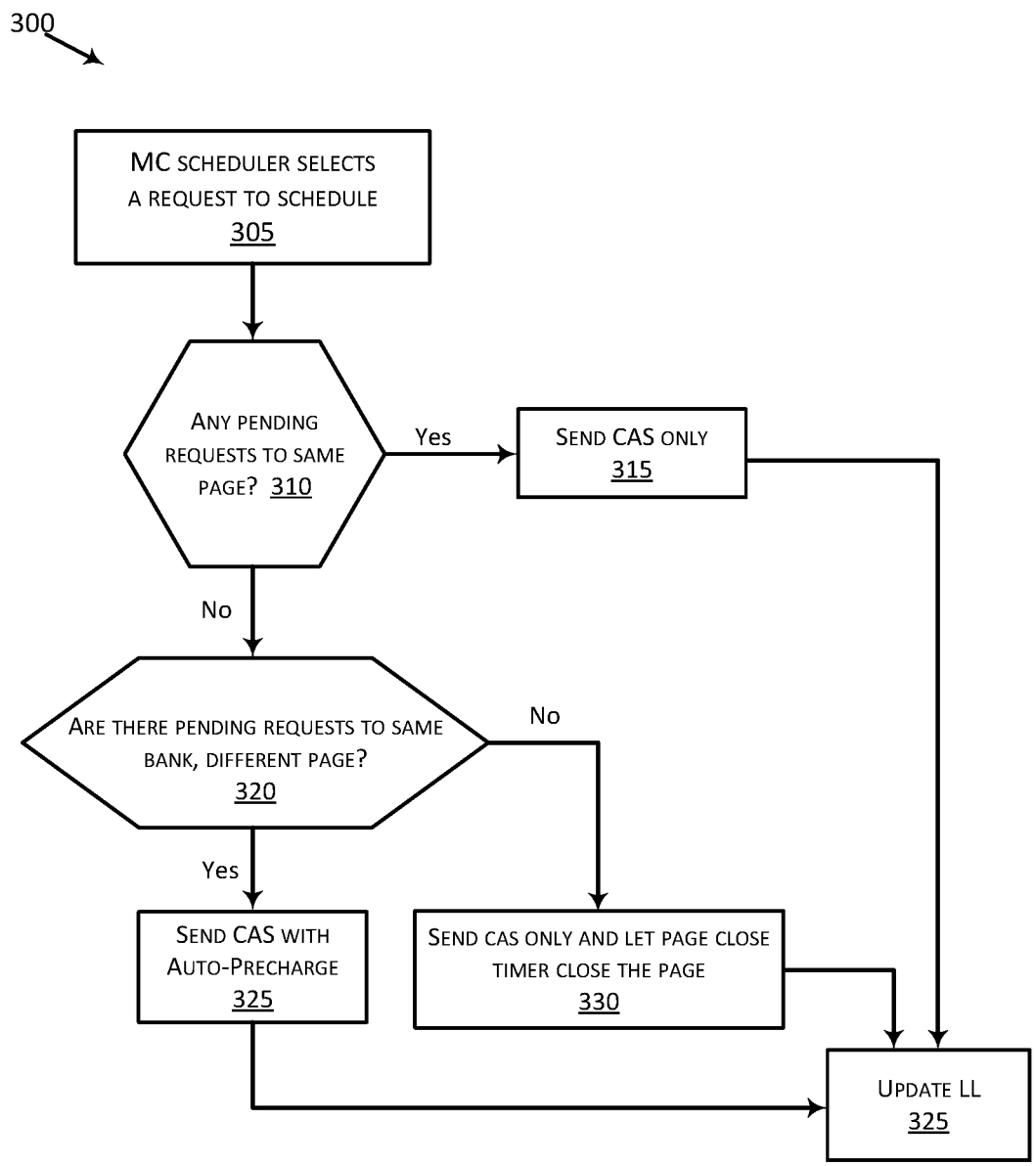
FIG. 3 is a block flow diagram illustrating a scheduling of a memory request by a memory controller, according to some embodiments.

FIG. 3 is a block flow diagram illustrating a flow of scheduling of a memory request by a memory controller, according to some embodiments. As shown, execution of flow 300 begins at 305 when a memory controller (MC), such as MC 220 of FIG. 2, selects a request to schedule from a memory request queue (MRQ), such as MRQ 222 of FIG. 2. At 310, the MC determines whether there are any pending requests enqueued to the same page. If so, meaning that additional requests to the same page are pending, the MC at 315 sends a CAS only to access the requested portion of the page, then at 325 updates the linked list.

But, if the MC determines at 310 that no further requests to the same page are pending, the MC at 320 determines whether there are any pending requests enqueued to a different page on the same bank, in which case the MC at 325 sends the combined CAS and AP (auto-precharge), which closes the row and precharges the storage cell array for the next access. Then, at 325, the MC updates the linked list.

But, if the MC determines at 320 that no further requests to the same bank are pending, the MC at 330 sends the CAS only, and lets the page close policy, such as page close timer 226, close the page. Then, at 325, the MC updates the linked list.

By avoiding sending an AP that would automatically and immediately close the page, the MC advantageously avoids potentially prematurely closing the page. The MC thus avoids the glass jaw that would arise by closing the page prematurely, i.e., when another memory request to the same page is shortly to arrive. Moreover, disclosed embodiments can tune the timing threshold applied by the page close policy (e.g., page close timer) to adjust to a size of a gap between subsequent requests to the same page.

Figure 4:
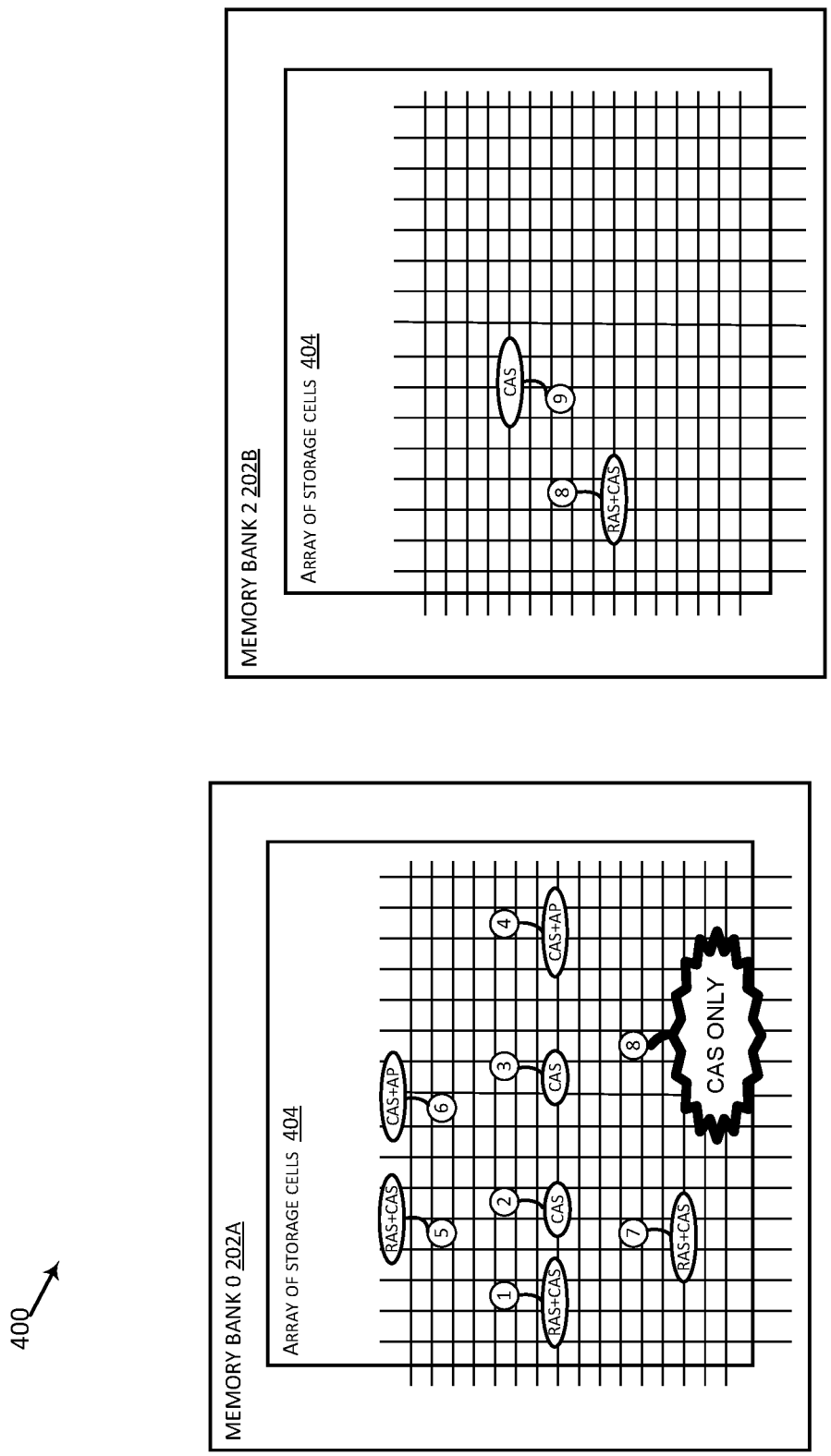
FIG. 4 provides a numerical example to illustrate scheduling of memory access requests with enhanced auto-precharge, according to some embodiments.

FIG. 4 provides a numerical example to illustrate scheduling of memory access requests with enhanced auto-precharge, according to some embodiments. As shown, memory 400 has two memory banks 202A and 202B, each of which includes an array of storage cells 404.

Also shown is a sequence of nine different locations of memory 400 to be accessed according to some embodiments. A memory controller (MC) processes Location 1 by first generating a RAS to activate a selected row. The MC then, like operation 315, sends a CAS only, in order to access the selected element at Location 1. The MC processes Locations 2 and 3 similarly, like operation 315, sending a CAS to access the element. When processing Location 4, the MC determines, like operation 310, that no further requests to the same page are pending, and, like operation 320, determines that further requests to a different page in the same bank are pending. So, like operation 325, the MC sends the combined CAS_AP to access Location 4 and then close the row and precharge.

The MC processes Location 5, as with Location 1, by first generating a RAS to activate a selected row, the, like operation 315, sending a CAS to access the selected element. The MC processes location 6, similarly to Location 4, by determining, like operation 320, that further requests to a different page in the same bank are pending, and, like operation 325, sending a combined CAS_AP to access the element, then close the row and precharge.

The MC processes location 7, as with locations 1 and 5, by first generating a RAS to activate a selected row, then, like operation 315, sending a CAS to access the selected element, But the MC processes location 8 by, like operation 330, sending a CAS only and allowing the page close policy (e.g., page close timer) close the page. Advantageously, then, the MC avoids prematurely closing the page before another access to the page arrives.

FIG. 5 is pseudocode illustrating an embodiment of scheduling memory requests. Pseudocode 500 illustrates operations similarly to the flows depicted in FIG. 3 and FIG. 4. In particular, a memory controller executing pseudocode 500 sometimes advantageously avoids prematurely closing a page by sending a CAS only and allowing the page close policy (e.g., page close timer) to close the page.

Figure 6:
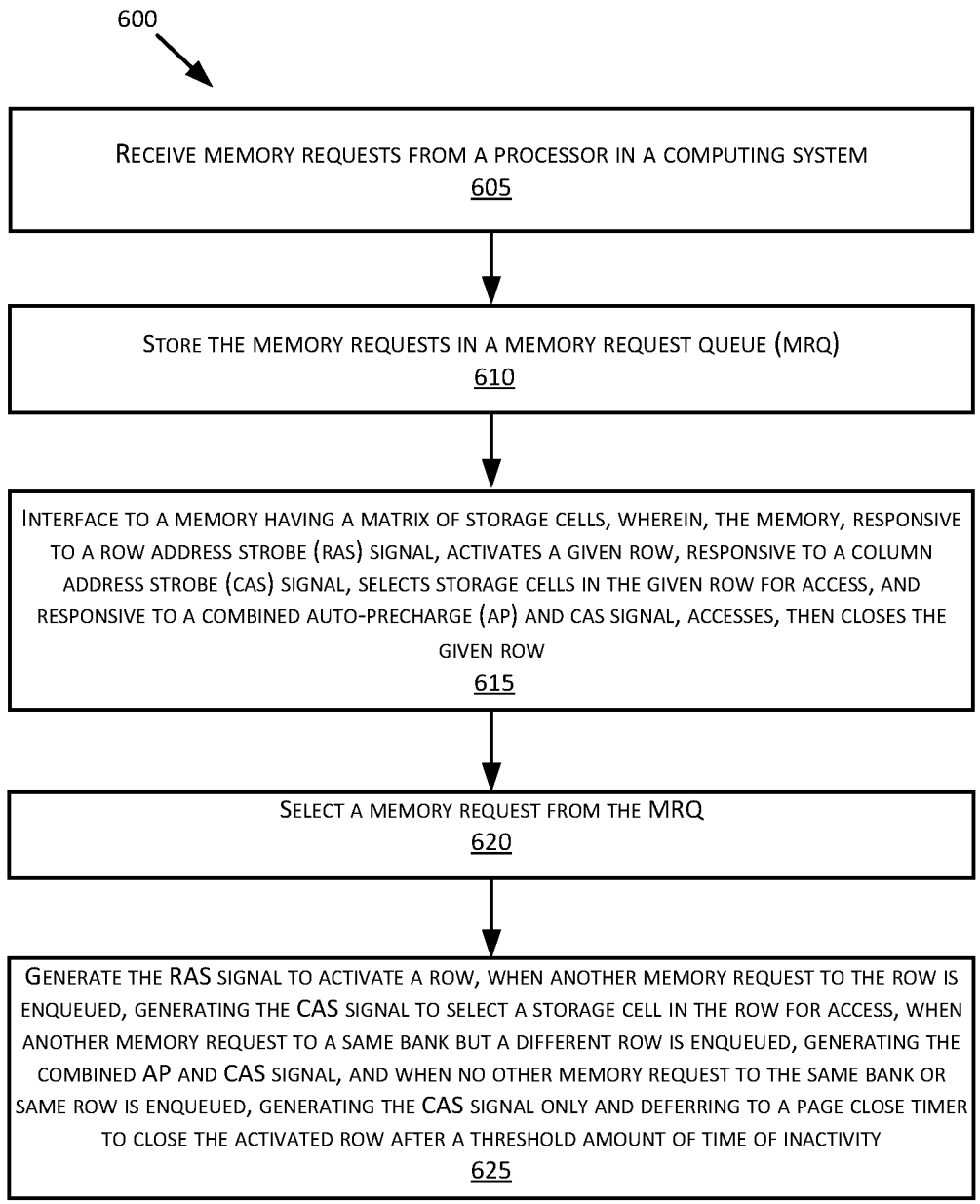
FIG. 6 is a process flow diagram illustrating a process of scheduling memory requests by a memory controller, according to some embodiments.

FIG. 6 is a process flow diagram illustrating a process of scheduling memory requests by a memory controller, according to some embodiments. As shown, a memory controller (MC) is to execute flow 600. At 605, the MC receive memory requests from a processor in a computing system. At 610, the MC stores the memory requests in a memory request queue (MRQ). At 615, the MC interfaces to a memory comprising a matrix of storage cells, wherein, responsive to a row address strobe (RAS) signal, a given row is activated, responsive to a column address strobe (CAS) signal, storage cells in the given row are selected for access, and responsive to a combined auto-precharge (AP) and CAS signal, the given row is accessed and then closed. At 620, the MC selects a memory request from the MRQ. At 625, the MC generates the RAS signal to activate a row, when another memory request to the row is enqueued, generates the CAS signal to select a storage cell in the row for access, when another memory request to a same bank but a different row is enqueued, generating the combined AP and CAS signal, and when no other memory request to the same bank or same row is enqueued, generating the CAS signal only, deferring to a page close timer to close the activated row after a threshold amount of time of inactivity.

Performance Results

Figure 7:
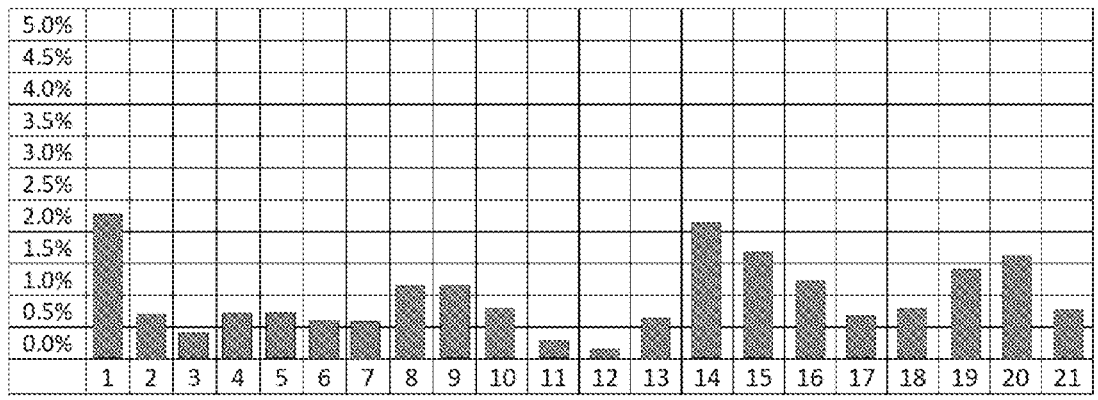
FIG. 7 illustrates performance results, showing improvements due to embodiments.

FIG. 7 is a chart of performance results, showing a gain in frame rate owed to disclosed embodiments. As shown, chart 700 captures simulation results generated by running a cycle-accurate simulation of a processor running 21 different benchmarks spanning different categories such as 3D and compute operations. In addition, simulations were run using a sweep of different threshold values for the page close timer (e.g., page close timer 226). The performance metric presented in the graph is "Gain in Frame Rate" which is representative of the amount of time taken to complete one unit of work.

As can be seen, using the disclosed enhanced auto-precharge policy can yield anywhere between 0.5% and 2.2% gain in frame rate.

Instruction Sets

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 8A:
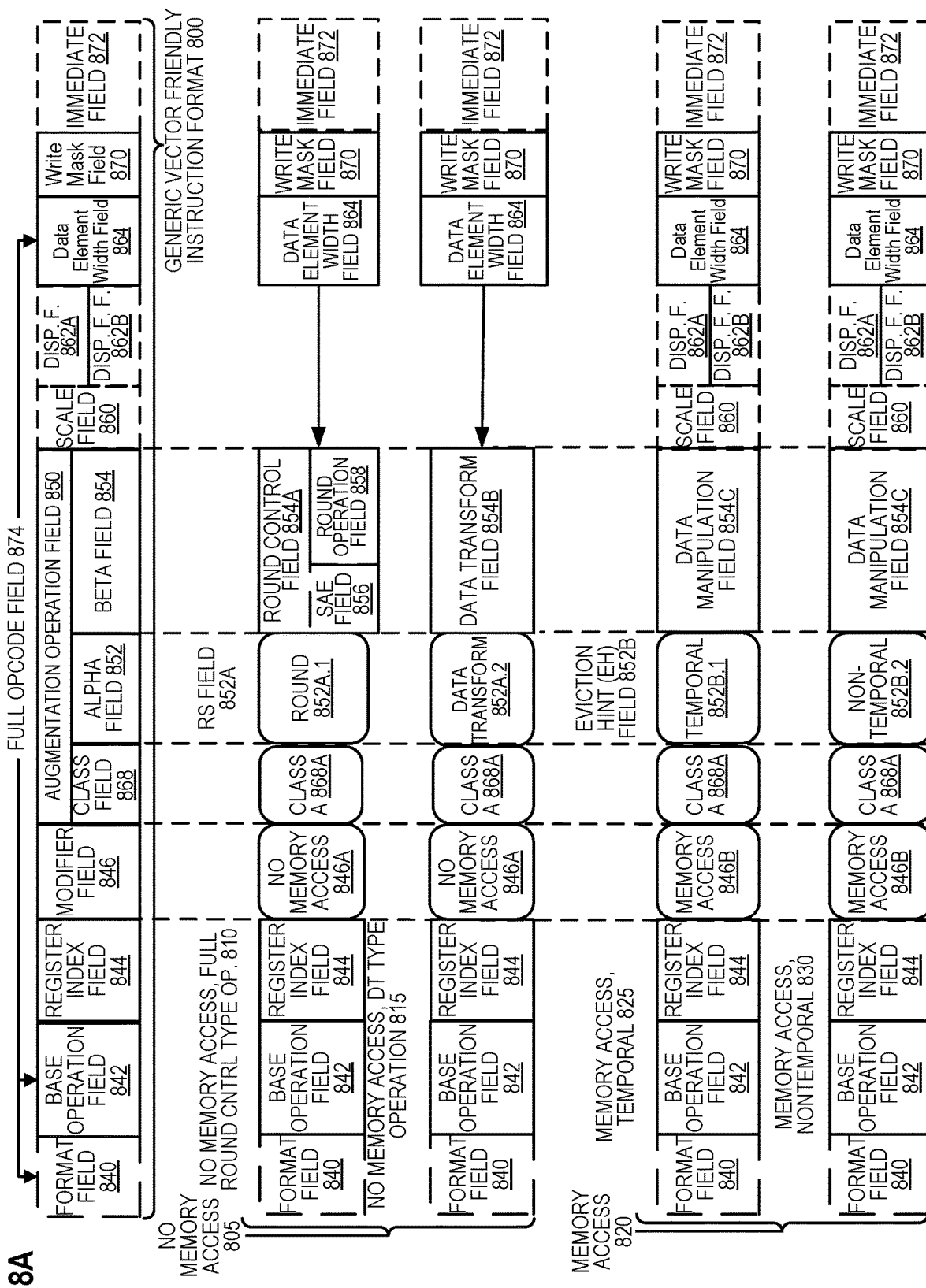
FIGS. 8A-8B are block diagrams illustrating a generic vector friendly instruction format and instruction templates thereof according to some embodiments of the invention.
Figure 8B:
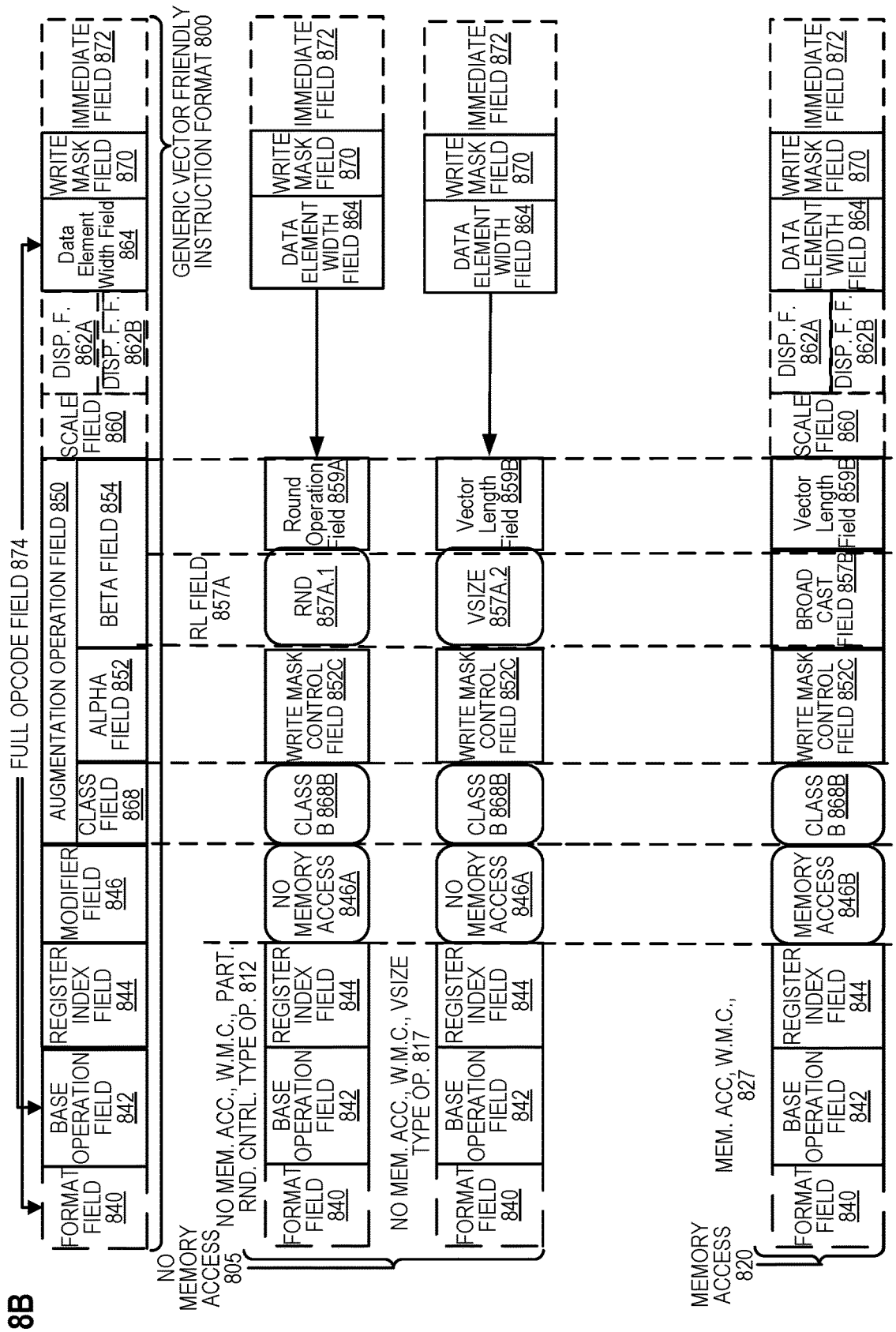

FIGS. 8A-8B are block diagrams illustrating a generic vector friendly instruction format and instruction templates thereof according to some embodiments of the invention. FIG. 8A is a block diagram illustrating a generic vector friendly instruction format and class A instruction templates thereof according to some embodiments of the invention; while FIG. 8B is a block diagram illustrating the generic vector friendly instruction format and class B instruction templates thereof according to some embodiments of the invention. Specifically, a generic vector friendly instruction format 800 for which are defined class A and class B instruction templates, both of which include no memory access 805 instruction templates and memory access 820 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 8A include: 1) within the no memory access 805 instruction templates there is shown a no memory access, full round control type operation 810 instruction template and a no memory access, data transform type operation 815 instruction template; and 2) within the memory access 820 instruction templates there is shown a memory access, temporal 825 instruction template and a memory access, non-temporal 830 instruction template. The class B instruction templates in FIG. 8B include: 1) within the no memory access 805 instruction templates there is shown a no memory access, write mask control, partial round control type operation 812 instruction template and a no memory access, write mask control, vsize type operation 817 instruction template; and 2) within the memory access 820 instruction templates there is shown a memory access, write mask control 827 instruction template.

The generic vector friendly instruction format 800 includes the following fields listed below in the order illustrated in FIGS. 8A-8B.

Format field 840—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 842—its content distinguishes different base operations.

Register index field 844—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 846—its content distinguishes occurrences of instructions in the generic vector instruction format that specify memory access from those that do not; that is, between no memory access 805 instruction templates and memory access 820 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 850—its content distinguishes which one of a variety of different operations to be performed in addition to the base operation. This field is context specific. In some embodiments, this field is divided into a class field 868, an alpha field 852, and a beta field 854. The augmentation operation field 850 allows common groups of operations to be performed in a single instruction rather than 2, 3, or 4 instructions.

Scale field 860—its content allows for the scaling of the index field's content for memory address generation (e.g., for address generation that uses $2^{scale}*\text{index}+\text{base}$).

Displacement Field 862A—its content is used as part of memory address generation (e.g., for address generation that uses $2^{scale}*\text{index}+\text{base}+\text{displacement}$).

Displacement Factor Field 862B (note that the juxtaposition of displacement field 862A directly over displacement factor field 862B indicates one or the other is used)—its content is used as part of address generation; it specifies a displacement factor that is to be scaled by the size of a memory access (N)—where N is the number of bytes in the memory access (e.g., for address generation that uses $2^{scale}*\text{index}+\text{base}+\text{scaled displacement}$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 874 (described later herein) and the data manipulation field 854C. The displacement field 862A and the displacement factor field 862B are optional in the sense that they are not used for the no memory access 805 instruction templates and/or different embodiments may implement only one or none of the two.

Data element width field 864—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 870—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 870 allows for partial vector operations, including loads, stores, arithmetic, logical, etc. While embodiments of the invention are described in which the write mask field's 870 content selects one of a number of write mask registers that contains the write mask to be used (and thus the write mask field's 870 content indirectly identifies that masking to be performed), alternative embodiments instead or additional allow the write mask field's 870 content to directly specify the masking to be performed.

Immediate field 872—its content allows for the specification of an immediate. This field is optional in the sense that it is not present in an implementation of the generic vector friendly format that does not support immediate and it is not present in instructions that do not use an immediate.

Class field 868—its content distinguishes between different classes of instructions. With reference to FIGS. 8A-B, the contents of this field select between class A and class B instructions. In FIGS. 8A-B, rounded corner squares are used to indicate a specific value is present in a field (e.g., class A 868A and class B 868B for the class field 868 respectively in FIGS. 8A-B).

Instruction Templates of Class A

In the case of the non-memory access 805 instruction templates of class A, the alpha field 852 is interpreted as an RS field 852A, whose content distinguishes which one of the different augmentation operation types are to be performed (e.g., round 852A.1 and data transform 852A.2 are respectively specified for the no memory access, round type operation 810 and the no memory access, data transform type operation 815 instruction templates), while the beta field 854 distinguishes which of the operations of the specified type is to be performed. In the no memory access 805 instruction templates, the scale field 860, the displacement field 862A, and the displacement factor field 862B are not present.

No-Memory Access Instruction Templates—Full Round Control Type Operation

In the no memory access full round control type operation 810 instruction template, the beta field 854 is interpreted as a round control field 854A, whose content(s) provide static rounding. While in the described embodiments of the invention the round control field 854A includes a suppress all floating-point exceptions (SAE) field 856 and a round operation control field 858, alternative embodiments may encode both these concepts into the same field or only have one or the other of these concepts/fields (e.g., may have only the round operation control field 858).

SAE field 856—its content distinguishes whether or not to disable the exception event reporting; when the SAE field's 856 content indicates suppression is enabled, a given instruction does not report any kind of floating-point exception flag and does not raise any floating-point exception handler.

Round operation control field 858—its content distinguishes which one of a group of rounding operations to perform (e.g., Round-up, Round-down, Round-towards-zero and Round-to-nearest). Thus, the round operation control field 858 allows for the changing of the rounding mode on a per instruction basis. In some embodiments where a processor includes a control register for specifying rounding modes, the round operation control field's 850 content overrides that register value.

No Memory Access Instruction Templates—Data Transform Type Operation

In the no memory access data transform type operation 815 instruction template, the beta field 854 is interpreted as a data transform field 854B, whose content distinguishes which one of a number of data transforms is to be performed (e.g., no data transform, swizzle, broadcast).

In the case of a memory access 820 instruction template of class A, the alpha field 852 is interpreted as an eviction hint field 852B, whose content distinguishes which one of the eviction hints is to be used (in FIG. 8A, temporal 852B.1 and non-temporal 852B.2 are respectively specified for the memory access, temporal 825 instruction template and the memory access, non-temporal 830 instruction template), while the beta field 854 is interpreted as a data manipulation field 854C, whose content distinguishes which one of a number of data manipulation operations (also known as primitives) is to be performed (e.g., no manipulation; broadcast; up conversion of a source; and down conversion of a destination). The memory access 820 instruction templates include the scale field 860, and optionally the displacement field 862A or the displacement factor field 862B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 852 is interpreted as a write mask control (Z) field 852C, whose content distinguishes whether the write masking controlled by the write mask field 870 should be a merging or a zeroing.

In the case of the non-memory access 805 instruction templates of class B, part of the beta field 854 is interpreted as an RL field 857A, whose content distinguishes which one of the different augmentation operation types are to be performed (e.g., round 857A.1 and vector length (VSIZE) 857A.2 are respectively specified for the no memory access, write mask control, partial round control type operation 812 instruction template and the no memory access, write mask control, VSIZE type operation 817 instruction template), while the rest of the beta field 854 distinguishes which of the operations of the specified type is to be performed. In the no memory access 805 instruction templates, the scale field 860, the displacement field 862A, and the displacement factor field 862B are not present.

In the no memory access, write mask control, partial round control type operation 810 instruction template, the rest of the beta field 854 is interpreted as a round operation field 859A and exception event reporting is disabled (a given instruction does not report any kind of floating-point exception flag and does not raise any floating-point exception handler).

Round operation control field 859A—just as round operation control field 858, its content distinguishes which one of a group of rounding operations to perform (e.g., Round-up, Round-down, Round-towards-zero and Round-to-nearest). Thus, the round operation control field 859A allows for the changing of the rounding mode on a per instruction basis. In some embodiments where a processor includes a control register for specifying rounding modes, the round operation control field's 850 content overrides that register value.

In the no memory access, write mask control, VSIZE type operation 817 instruction template, the rest of the beta field 854 is interpreted as a vector length field 859B, whose content distinguishes which one of a number of data vector lengths is to be performed on (e.g., 128, 256, or 512 byte).

In the case of a memory access 820 instruction template of class B, part of the beta field 854 is interpreted as a broadcast field 857B, whose content distinguishes whether or not the broadcast type data manipulation operation is to be performed, while the rest of the beta field 854 is interpreted the vector length field 859B. The memory access 820 instruction templates include the scale field 860, and optionally the displacement field 862A or the displacement factor field 862B.

With regard to the generic vector friendly instruction format 800, a full opcode field 874 is shown including the format field 840, the base operation field 842, and the data element width field 864. While one embodiment is shown where the full opcode field 874 includes all of these fields, the full opcode field 874 includes less than all of these fields in embodiments that do not support all of them. The full opcode field 874 provides the operation code (opcode).

The augmentation operation field 850, the data element width field 864, and the write mask field 870 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 9A is a block diagram illustrating an exemplary specific vector friendly instruction format according to some embodiments of the invention. FIG. 9A shows a specific vector friendly instruction format 900 that is specific in the sense that it specifies the location, size, interpretation, and order of the fields, as well as values for some of those fields. The specific vector friendly instruction format 900 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 8A or 8B into which the fields from FIG. 9A map are illustrated.

It should be understood that, although embodiments of the invention are described with reference to the specific vector friendly instruction format 900 in the context of the generic vector friendly instruction format 800 for illustrative purposes, the invention is not limited to the specific vector friendly instruction format 900 except where claimed. For example, the generic vector friendly instruction format 800 contemplates a variety of possible sizes for the various fields, while the specific vector friendly instruction format 900 is shown as having fields of specific sizes. By way of specific example, while the data element width field 864 is illustrated as a one bit field in the specific vector friendly instruction format 900, the invention is not so limited (that is, the generic vector friendly instruction format 800 contemplates other sizes of the data element width field 864).

The specific vector friendly instruction format 900 includes the following fields listed below in the order illustrated in FIG. 9A.

EVEX Prefix (Bytes 0-3) 902—is encoded in a four-byte form.

Format Field 840 (EVEX Byte 0, bits [7:0])—the first byte (EVEX Byte 0) is the format field 840 and it contains 0x62 (the unique value used for distinguishing the vector friendly instruction format in some embodiments).

The second-fourth bytes (EVEX Bytes 1-3) include a number of bit fields providing specific capability.

REX field 905 (EVEX Byte 1, bits [7-5])—consists of a EVEX.R bit field (EVEX Byte 1, bit [7]—R), EVEX.X bit field (EVEX byte 1, bit [6]—X), and EVEX.B bit field (EVEX byte 1, bit[5]—B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' 910A—this is the first part of the REX' field 910 and is the EVEX.R' bit field (EVEX Byte 1, bit [4]—R') that is used to encode either the upper 16 or lower 16 of the extended 32 register set. In some embodiments, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 915 (EVEX byte 1, bits [3:0]—mmmm)—its content encodes an implied leading opcode byte (0F, 0F 38, or 0F 3).

Data element width field 864 (EVEX byte 2, bit [7]—W)—is represented by the notation EVEX.W. EVEX.W is used to define the granularity (size) of the datatype (either 32-bit data elements or 64-bit data elements).

EVEX.vvvv 920 (EVEX Byte 2, bits [6:3]—vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 920 encodes the 4 low-order bits of the first source register specifier stored in inverted (1s complement) form. Depending on the instruction, an extra different EVEX bit field is used to extend the specifier size to 32 registers.

EVEX.U 868 Class field (EVEX byte 2, bit [2]—U)—If EVEX.U=0, it indicates class A or EVEX.U0; if EVEX.U=1, it indicates class B or EVEX.U1.

Prefix encoding field 925 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 852 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 854 (EVEX byte 3, bits [6:4]—SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' 910B—this is the remainder of the REX' field 910 and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 870 (EVEX byte 3, bits [2:0]—kkk)—its content specifies the index of a register in the write mask registers as previously described. In some embodiments, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 930 (Byte 4) is also known as the opcode byte. Part of the opcode is specified in this field.

MOD R/M Field 940 (Byte 5) includes MOD field 942, Reg field 944, and R/M field 946. As previously described, the MOD field's 942 content distinguishes between memory access and non-memory access operations. The role of Reg field 944 can be summarized to two situations: encoding either the destination register operand or a source register operand or be treated as an opcode extension and not used to encode any instruction operand. The role of R/M field 946 may include the following: encoding the instruction operand that references a memory address or encoding either the destination register operand or a source register operand.

Scale, Index, Base (SIB) Byte (Byte 6)—As previously described, the scale field's 850 content is used for memory address generation. SIB.xxx 954 and SIB.bbb 956—the contents of these fields have been previously referred to with regard to the register indexes Xxxx and Bbbb.

Displacement field 862A (Bytes 7-10)—when MOD field 942 contains 10, bytes 7-10 are the displacement field 862A, and it works the same as the legacy 32-bit displacement (disp32) and works at byte granularity.

Displacement factor field 862B (Byte 7)—when MOD field 942 contains 01, byte 7 is the displacement factor field 862B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 862B is a reinterpretation of disp8; when using displacement factor field 862B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 862B substitutes the legacy x86 instruction set 8-bit displacement. Thus, the displacement factor field 862B is encoded the same way as an x86 instruction set 8-bit displacement (so no changes in the Mod RM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 872 operates as previously described.

Full Opcode Field

FIG. 9B is a block diagram illustrating the fields of the specific vector friendly instruction format 900 that make up the full opcode field 874 according to some embodiments. Specifically, the full opcode field 874 includes the format field 840, the base operation field 842, and the data element width (W) field 864. The base operation field 842 includes the prefix encoding field 925, the opcode map field 915, and the real opcode field 930.

Register Index Field

FIG. 9C is a block diagram illustrating the fields of the specific vector friendly instruction format 900 that make up the register index field 844 according to some embodiments. Specifically, the register index field 844 includes the REX field 905, the REX' field 910, the MOD R/M.reg field 944, the MOD R/M.r/m field 946, the VVVV field 920, xxx field 954, and the bbb field 956.

Augmentation Operation Field

Figure 9D:
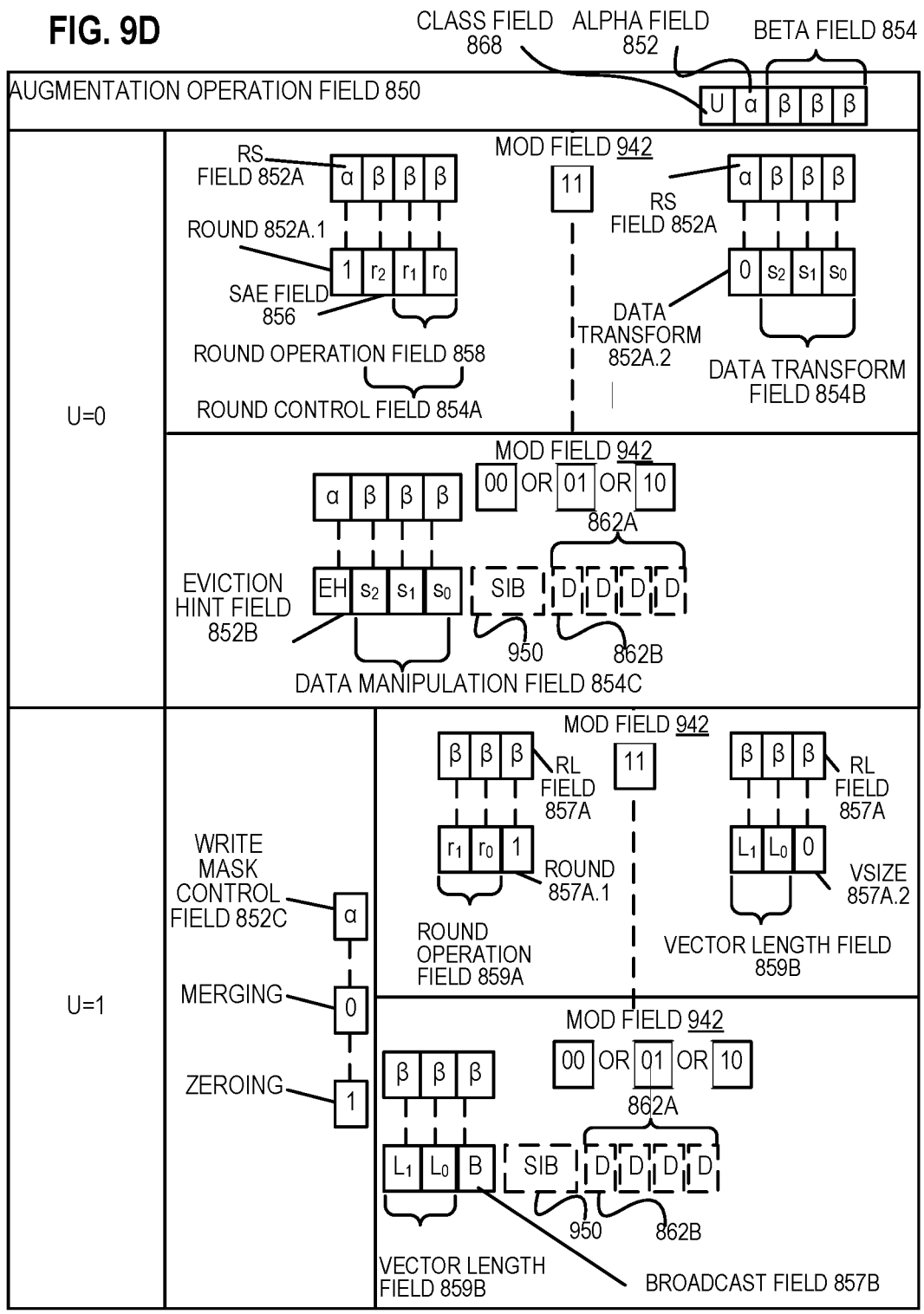
FIG. 9D is a block diagram illustrating the fields of the specific vector friendly instruction format that make up the augmentation operation field according to one embodiment.

FIG. 9D is a block diagram illustrating the fields of the specific vector friendly instruction format 900 that make up the augmentation operation field 850 according to some embodiments. When the class (U) field 868 contains 0, it signifies EVEX.U0 (class A 868A); when it contains 1, it signifies EVEX.U1 (class B 868B). When U=0 and the MOD field 942 contains 11 (signifying a no memory access operation), the alpha field 852 (EVEX byte 3, bit [7]—EH) is interpreted as the rs field 852A. When the rs field 852A contains a 1 (round 852A.1), the beta field 854 (EVEX byte 3, bits [6:4]—SSS) is interpreted as the round control field 854A. The round control field 854A includes a one bit SAE field 856 and a two bit round operation field 858. When the rs field 852A contains a 0 (data transform 852A.2), the beta field 854 (EVEX byte 3, bits [6:4]—SSS) is interpreted as a three bit data transform field 854B. When U=0 and the MOD field 942 contains 00, 01, or 10 (signifying a memory access operation), the alpha field 852 (EVEX byte 3, bit [7]—EH) is interpreted as the eviction hint (EH) field 852B and the beta field 854 (EVEX byte 3, bits [6:4]—SSS) is interpreted as a three bit data manipulation field 854C.

When U=1, the alpha field 852 (EVEX byte 3, bit [7]—EH) is interpreted as the write mask control (Z) field 852C. When U=1 and the MOD field 942 contains 11 (signifying a no memory access operation), part of the beta field 854 (EVEX byte 3, bit [4]—S$_0$) is interpreted as the RL field 857A; when it contains a 1 (round 857A.1) the rest of the beta field 854 (EVEX byte 3, bit [6-5]—S$_{2-1}$) is interpreted as the round operation field 859A, while when the RL field 857A contains a 0 (VSIZE 857.A2) the rest of the beta field 854 (EVEX byte 3, bit [6-5]—S$_{2-1}$) is interpreted as the vector length field 859B (EVEX byte 3, bit [6-5]—L$_{1-0}$). When U=1 and the MOD field 942 contains 00, 01, or 10 (signifying a memory access operation), the beta field 854 (EVEX byte 3, bits [6:4]—SSS) is interpreted as the vector length field 859B (EVEX byte 3, bit [6-5]—L$_{1-0}$) and the broadcast field 857B (EVEX byte 3, bit [4]—B).

Exemplary Register Architecture

Figure 10:
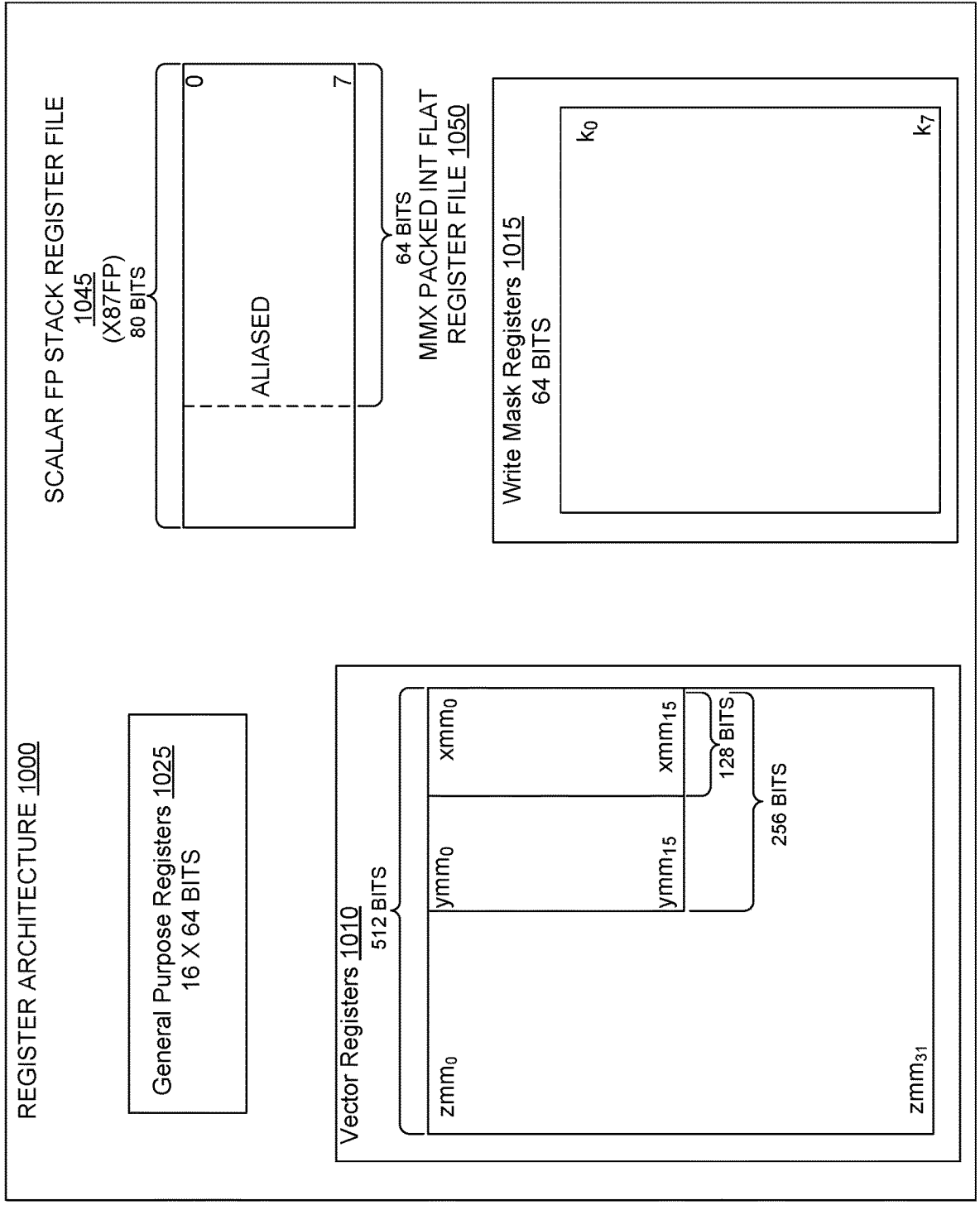
FIG. 10 is a block diagram of a register architecture according to one embodiment.

FIG. 10 is a block diagram of a register architecture 1000 according to some embodiments. In the embodiment illustrated, there are 32 vector registers 1010 that are 512 bits wide; these registers are referenced as zmm0 through zmm31. The lower order 256 bits of the lower 16 zmm registers are overlaid on registers ymm0-15. The lower order 128 bits of the lower 16 zmm registers (the lower order 128 bits of the ymm registers) are overlaid on registers xmm0-15. The specific vector friendly instruction format 900 operates on these overlaid register file as illustrated in the below tables.

| Adjustable Vector Length | Class | Operations | Registers |
|---|---|---|---|
| Instruction Templates that do not include the vector length field 859B | A (FIG. 8A; U = 0) | 810, 815, 825, 830 | zmm registers (the vector length is 64 byte) |
| | B (FIG. 8B; U = 1) | 812 | zmm registers (the vector length is 64 byte) |
| Instruction templates that do include the vector length field 859B | B (FIG. 8B; U = 1) | 817, 827 | zmm, ymm, or xmm registers (the vector length is 64 byte, 32 byte, or 16 byte) depending on the vector length field 859B |

In other words, the vector length field 859B selects between a maximum length and one or more other shorter lengths, where each such shorter length is half the length of the preceding length; and instructions templates without the vector length field 859B operate on the maximum vector length. Further, in one embodiment, the class B instruction templates of the specific vector friendly instruction format 900 operate on packed or scalar single/double-precision floating-point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 1015—in the embodiment illustrated, there are 8 write mask registers (k0 through k7), each 64 bits in size. In an alternate embodiment, the write mask registers 1015 are 16 bits in size. As previously described, in some embodiments, the vector mask register k0 cannot be used as a write mask; when the encoding that would normally indicate k0 is used for a write mask, it selects a hardwired write mask of 0xffff, effectively disabling write masking for that instruction.

General-purpose registers 1025—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating-point stack register file (x87 stack) 1045, on which is aliased the MMX packed integer flat register file 1050—in the embodiment illustrated, the x87 stack is an eight-element stack used to perform scalar floating-point operations on 32/64/80-bit floating-point data using the x87 instruction set extension; while the MMX registers are used to perform operations on 64-bit packed integer data, as well as to hold operands for some operations performed between the MMX and XMM registers.

Alternative embodiments may use wider or narrower registers. Additionally, alternative embodiments may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 11A is a block diagram illustrating both an exemplary in-order pipeline and an exemplary register renaming, out-of-order issue/execution pipeline according to some embodiments of the invention. FIG. 11B is a block diagram illustrating both an exemplary embodiment of an in-order architecture core and an exemplary register renaming, out-of-order issue/execution architecture core to be included in a processor according to some embodiments of the invention. The solid lined boxes in FIGS. 11A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 11A, a processor pipeline 1100 includes a fetch stage 1102, a length decode stage 1104, a decode stage 1106, an allocation stage 1108, a renaming stage 1110, a scheduling (also known as a dispatch or issue) stage 1112, a register read/memory read stage 1114, an execute stage 1116, a write back/memory write stage 1118, an exception handling stage 1122, and a commit stage 1124.

FIG. 11B shows processor core 1190 including a front end unit 1130 coupled to an execution engine unit 1150, and both are coupled to a memory unit 1170. The core 1190 may be a reduced instruction set computing (RISC) core, a complex instruction set computing (CISC) core, a very long instruction word (VLIW) core, or a hybrid or alternative core type. As yet another option, the core 1190 may be a special-purpose core, such as, for example, a network or communication core, compression engine, coprocessor core, general purpose computing graphics processing unit (GPGPU) core, graphics core, or the like.

The front end unit 1130 includes a branch prediction unit 1132 coupled to an instruction cache unit 1134, which is coupled to an instruction translation lookaside buffer (TLB) 1136, which is coupled to an instruction fetch unit 1138, which is coupled to a decode unit 1140. The decode unit 1140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1190 includes a microcode ROM or other medium that stores microcode for certain macroinstructions (e.g., in decode unit 1140 or otherwise within the front end unit 1130). The decode unit 1140 is coupled to a rename/allocator unit 1152 in the execution engine unit 1150.

The execution engine unit 1150 includes the rename/allocator unit 1152 coupled to a retirement unit 1154 and a set of one or more scheduler unit(s) 1156. The scheduler unit(s) 1156 represents any number of different schedulers, including reservations stations, central instruction window, etc. The scheduler unit(s) 1156 is coupled to the physical register file(s) unit(s) 1158. Each of the physical register file(s) units 1158 represents one or more physical register files, different ones of which store one or more different data types, such as scalar integer, scalar floating-point, packed integer, packed floating-point, vector integer, vector floating-point, status (e.g., an instruction pointer that is the address of the next instruction to be executed), etc. In one embodiment, the physical register file(s) unit 1158 comprises a vector registers unit, a write mask registers unit, and a scalar registers unit. These register units may provide architectural vector registers, vector mask registers, and general purpose registers. The physical register file(s) unit(s) 1158 is overlapped by the retirement unit 1154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1154 and the physical register file(s) unit(s) 1158 are coupled to the execution cluster(s) 1160. The execution cluster(s) 1160 includes a set of one or more execution units 1162 and a set of one or more memory access units 1164. The execution units 1162 may perform various operations (e.g., shifts, addition, subtraction, multiplication) and on various types of data (e.g., scalar floating-point, packed integer, packed floating-point, vector integer, vector floating-point). While some embodiments may include a number of execution units dedicated to specific functions or sets of functions, other embodiments may include only one execution unit or multiple execution units that all perform all functions. The scheduler unit(s) 1156, physical register file(s) unit(s) 1158, and execution cluster(s) 1160 are shown as being possibly plural because certain embodiments create separate pipelines for certain types of data/operations (e.g., a scalar integer pipeline, a scalar floating-point/packed integer/packed floating-point/vector integer/vector floating-point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1164). It should also be understood that where separate pipelines are used, one or more of these pipelines may be out-of-order issue/execution and the rest in-order.

The set of memory access units 1164 is coupled to the memory unit 1170, which includes a data TLB unit 1172 coupled to a data cache unit 1174 coupled to a level 2 (L2)

cache unit 1176. In one exemplary embodiment, the memory access units 1164 may include a load unit, a store address unit, and a store data unit, each of which is coupled to the data TLB unit 1172 in the memory unit 1170. The instruction cache unit 1134 is further coupled to a level 2 (L2) cache unit 1176 in the memory unit 1170. The L2 cache unit 1176 is coupled to one or more other levels of cache and eventually to a main memory.

By way of example, the exemplary register renaming, out-of-order issue/execution core architecture may implement the pipeline 1100 as follows: 1) the instruction fetch 1138 performs the fetch and length decoding stages 1102 and 1104; 2) the decode unit 1140 performs the decode stage 1106; 3) the rename/allocator unit 1152 performs the allocation stage 1108 and renaming stage 1110; 4) the scheduler unit(s) 1156 performs the schedule stage 1112; 5) the physical register file(s) unit(s) 1158 and the memory unit 1170 perform the register read/memory read stage 1114; the execution cluster 1160 perform the execute stage 1116; 6) the memory unit 1170 and the physical register file(s) unit(s) 1158 perform the write back/memory write stage 1118; 7) various units may be involved in the exception handling stage 1122; and 8) the retirement unit 1154 and the physical register file(s) unit(s) 1158 perform the commit stage 1124.

The core 1190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1190 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1134/1174 and a shared L2 cache unit 1176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary in-Order Core Architecture

FIGS. 12A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 12A is a block diagram of a single processor core, along with its connection to the on-die interconnect network 1202 and with its local subset of the Level 2 (L2) cache 1204, according to some embodiments of the invention. In one embodiment, an instruction decoder 1200 supports the x86 instruction set with a packed data instruction set extension. An L1 cache 1206 allows low-latency accesses to cache memory into the scalar and vector units. While in one embodiment (to simplify the design), a scalar unit 1208 and a vector unit 1210 use separate register sets (respectively, scalar registers 1212 and vector registers 1214) and data transferred between them is written to memory and then read back in from a level 1 (L1) cache 1206, alternative embodiments of the invention may use a different approach (e.g., use a single register set or include a communication path that allow data to be transferred between the two register files without being written and read back).

The local subset of the L2 cache 1204 is part of a global L2 cache that is divided into separate local subsets, one per processor core. Each processor core has a direct access path to its own local subset of the L2 cache 1204. Data read by a processor core is stored in its L2 cache subset 1204 and can be accessed quickly, in parallel with other processor cores accessing their own local L2 cache subsets. Data written by a processor core is stored in its own L2 cache subset 1204 and is flushed from other subsets, if necessary. The ring network ensures coherency for shared data. The ring network is bi-directional to allow agents such as processor cores, L2 cache and other logic blocks to communicate with each other within the chip. Each ring data-path is 1012-bits wide per direction.

FIG. 12B is an expanded view of part of the processor core in FIG. 12A according to some embodiments of the invention. FIG. 12B includes an L1 data cache 1206A part of the L1 cache 1206, as well as more detail regarding the vector unit 1210 and the vector registers 1214. Specifically, the vector unit 1210 is a 16-wide vector processing unit (VPU) (see the 16-wide ALU 1228), which executes one or more of integer, single-precision float, and double-precision float instructions. The VPU supports swizzling the register inputs with swizzle unit 1220, numeric conversion with numeric convert units 1222A-B, and replication with replication unit 1224 on the memory input. Write mask registers 1226 allow predicating resulting vector writes.

Figure 13:
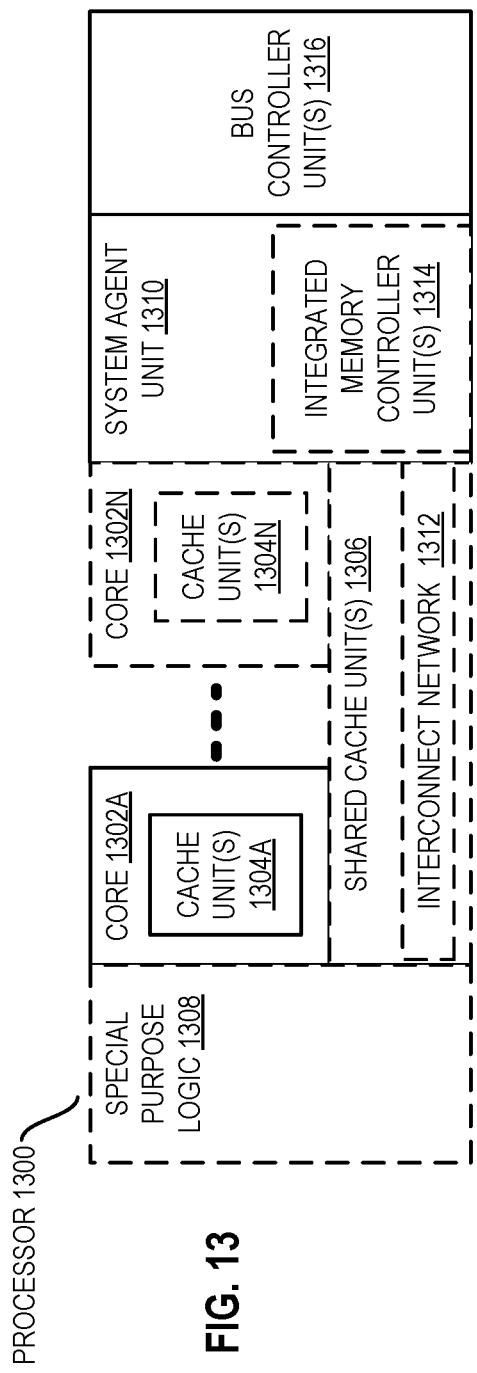
FIG. 13 is a block diagram of a processor that may have more than one core, may have an integrated memory controller, and may have integrated graphics according to some embodiments.

FIG. 13 is a block diagram of a processor 1300 that may have more than one core, may have an integrated memory controller, and may have integrated graphics according to some embodiments of the invention. The solid lined boxes in FIG. 13 illustrate a processor 1300 with a single core 1302A, a system agent 1310, a set of one or more bus controller units 1316, while the optional addition of the dashed lined boxes illustrates an alternative processor 1300 with multiple cores 1302A-N, a set of one or more integrated memory controller unit(s) 1314 in the system agent unit 1310, and special purpose logic 1308.

Thus, different implementations of the processor 1300 may include: 1) a CPU with the special purpose logic 1308 being integrated graphics and/or scientific (throughput) logic (which may include one or more cores), and the cores 1302A-N being one or more general purpose cores (e.g., general purpose in-order cores, general purpose out-of-order cores, a combination of the two); 2) a coprocessor with the cores 1302A-N being a large number of special purpose cores intended primarily for graphics and/or scientific (throughput); and 3) a coprocessor with the cores 1302A-N being a large number of general purpose in-order cores. Thus, the processor 1300 may be a general-purpose processor, coprocessor, or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1300 may be a part of and/or may be implemented on one or more substrates using any of a number of process technologies, such as, for example, BiCMOS, CMOS, or NMOS.

The memory hierarchy includes one or more levels of cache within the cores, a set of one or more shared cache units 1306, and external memory (not shown) coupled to the set of integrated memory controller units 1314. The set of shared cache units 1306 may include one or more mid-level caches, such as level 2 (L2), level 3 (L3), level 4 (L4), or other levels of cache, a last level cache (LLC), and/or combinations thereof. While in one embodiment a ring based interconnect unit 1312 interconnects the integrated graphics logic 1308 (integrated graphics logic 1308 is an example of and is also referred to herein as special purpose logic), the set of shared cache units 1306, and the system agent unit 1310/integrated memory controller unit(s) 1314, alternative embodiments may use any number of well-known techniques for interconnecting such units. In one embodiment, coherency is maintained between one or more cache units 1306 and cores 1302-A-N.

In some embodiments, one or more of the cores 1302A-N are capable of multithreading. The system agent 1310 includes those components coordinating and operating cores 1302A-N. The system agent unit 1310 may include for example a power control unit (PCU) and a display unit. The PCU may be or include logic and components needed for regulating the power state of the cores 1302A-N and the integrated graphics logic 1308. The display unit is for driving one or more externally connected displays.

The cores 1302A-N may be homogenous or heterogeneous in terms of architecture instruction set; that is, two or more of the cores 1302A-N may be capable of execution the same instruction set, while others may be capable of executing only a subset of that instruction set or a different instruction set.

Exemplary Computer Architectures

FIGS. 14-17 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 14:
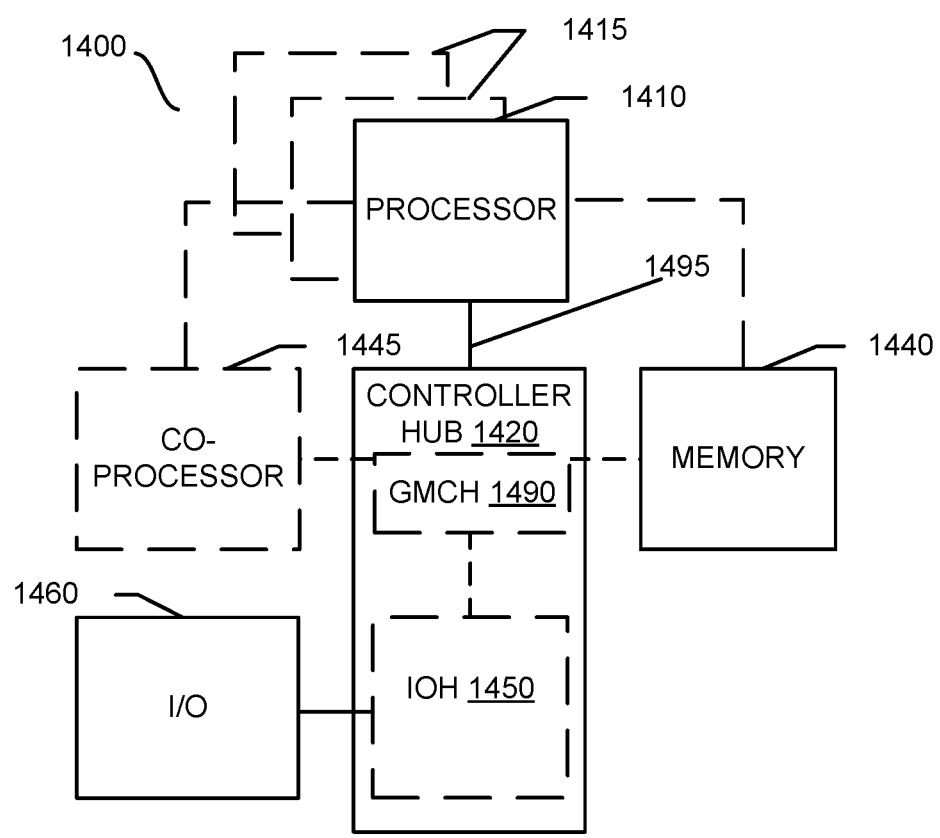
FIGS. 14-17 are block diagrams of exemplary computer architectures.

Referring now to FIG. 14, shown is a block diagram of a system 1400 in accordance with one embodiment of the present invention. The system 1400 may include one or more processors 1410, 1415, which are coupled to a controller hub 1420. In one embodiment the controller hub 1420 includes a graphics memory controller hub (GMCH) 1490 and an Input/Output Hub (IOH) 1450 (which may be on separate chips); the GMCH 1490 includes memory and graphics controllers to which are coupled memory 1440 and a coprocessor 1445; the IOH 1450 couples input/output (I/O) devices 1460 to the GMCH 1490. Alternatively, one or both of the memory and graphics controllers are integrated within the processor (as described herein), the memory 1440 and the coprocessor 1445 are coupled directly to the processor 1410, and the controller hub 1420 in a single chip with the IOH 1450.

The optional nature of additional processors 1415 is denoted in FIG. 14 with broken lines. Each processor 1410, 1415 may include one or more of the processing cores described herein and may be some version of the processor 1300.

The memory 1440 may be, for example, dynamic random access memory (DRAM), phase change memory (PCM), or a combination of the two. For at least one embodiment, the controller hub 1420 communicates with the processor(s) 1410, 1415 via a multi-drop bus, such as a frontside bus (FSB), point-to-point interface such as QuickPath Interconnect (QPI), or similar connection 1495.

In one embodiment, the coprocessor 1445 is a special-purpose processor, such as, for example, a high-throughput MIC processor, a network or communication processor, compression engine, graphics processor, GPGPU, embedded processor, or the like. In one embodiment, controller hub 1420 may include an integrated graphics accelerator.

There can be a variety of differences between the physical resources 1410, 1415 in terms of a spectrum of metrics of merit including architectural, microarchitectural, thermal, power consumption characteristics, and the like.

In one embodiment, the processor 1410 executes instructions that control data processing operations of a general type. Embedded within the instructions may be coprocessor instructions. The processor 1410 recognizes these coprocessor instructions as being of a type that should be executed by the attached coprocessor 1445. Accordingly, the processor 1410 issues these coprocessor instructions (or control signals representing coprocessor instructions) on a coprocessor bus or other interconnect, to coprocessor 1445. Coprocessor(s) 1445 accept and execute the received coprocessor instructions.

Figure 15:
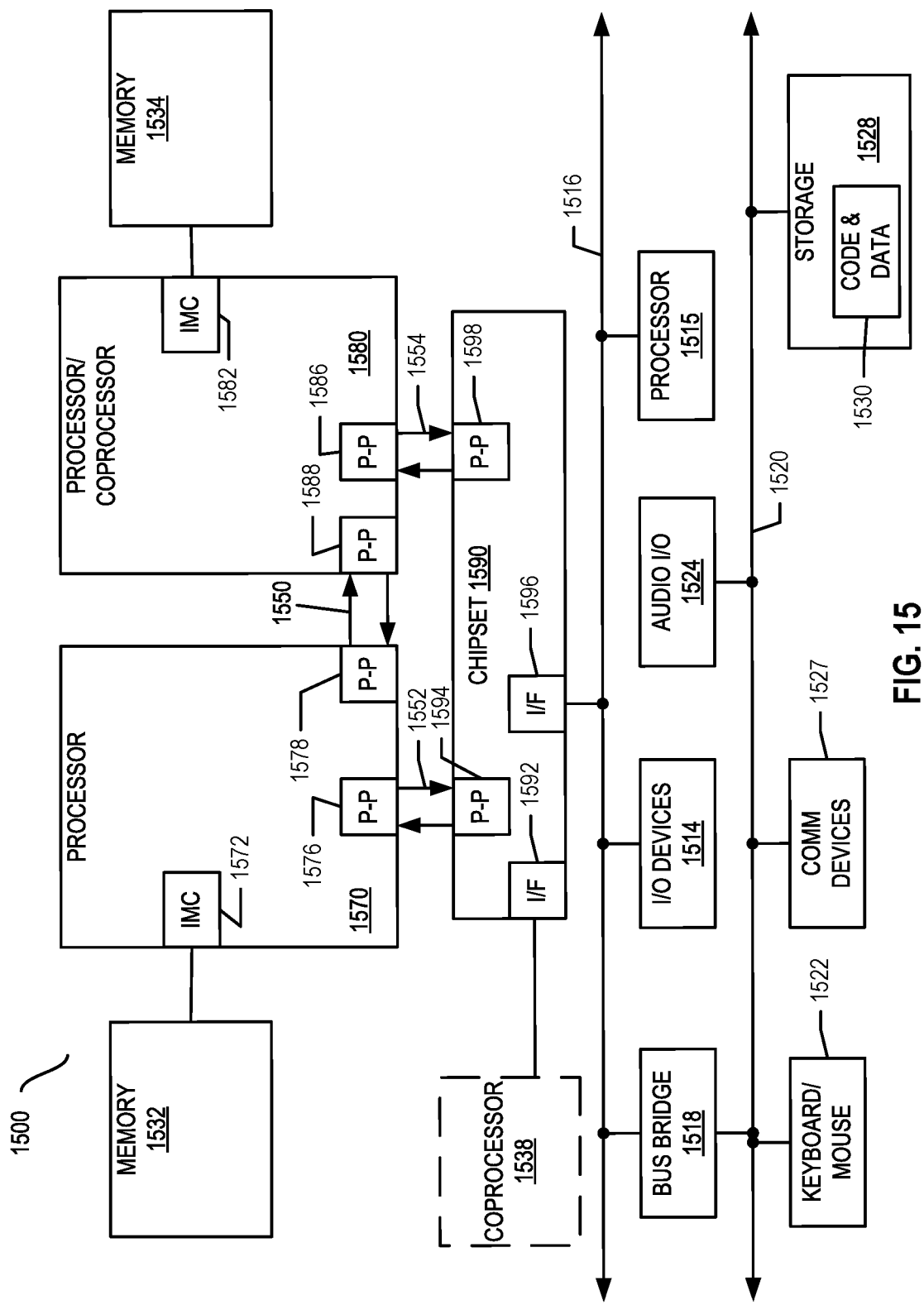

Referring now to FIG. 15, shown is a block diagram of a first more specific exemplary system 1500 in accordance with an embodiment of the present invention. As shown in FIG. 15, multiprocessor system 1500 is a point-to-point interconnect system, and includes a first processor 1570 and a second processor 1580 coupled via a point-to-point interconnect 1550. Each of processors 1570 and 1580 may be some version of the processor 1300. In some embodiments, processors 1570 and 1580 are respectively processors 1410 and 1415, while coprocessor 1538 is coprocessor 1445. In another embodiment, processors 1570 and 1580 are respectively processor 1410 coprocessor 1445.

Processors 1570 and 1580 are shown including integrated memory controller (IMC) units 1572 and 1582, respectively. Processor 1570 also includes as part of its bus controller units point-to-point (P-P) interfaces 1576 and 1578; similarly, second processor 1580 includes P-P interfaces 1586 and 1588. Processors 1570, 1580 may exchange information via a point-to-point (P-P) interface 1550 using P-P interface circuits 1578, 1588. As shown in FIG. 15, IMCs 1572 and 1582 couple the processors to respective memories, namely a memory 1532 and a memory 1534, which may be portions of main memory locally attached to the respective processors.

Processors 1570, 1580 may each exchange information with a chipset 1590 via individual P-P interfaces 1552, 1554 using point to point interface circuits 1576, 1594, 1586, 1598. Chipset 1590 may optionally exchange information with the coprocessor 1538 via a high-performance interface 1592. In one embodiment, the coprocessor 1538 is a special-purpose processor, such as, for example, a high-throughput MIC processor, a network or communication processor, compression engine, graphics processor, GPGPU, embedded processor, or the like.

A shared cache (not shown) may be included in either processor or outside of both processors yet connected with the processors via P-P interconnect, such that either or both processors' local cache information may be stored in the shared cache if a processor is placed into a low power mode.

Chipset 1590 may be coupled to a first bus 1516 via an interface 1596. In one embodiment, first bus 1516 may be a Peripheral Component Interconnect (PCI) bus, or a bus such as a PCI Express bus or another third generation I/O interconnect bus, although the scope of the present invention is not so limited.

As shown in FIG. 15, various I/O devices 1514 may be coupled to first bus 1516, along with a bus bridge 1518 which couples first bus 1516 to a second bus 1520. In one embodiment, one or more additional processor(s) 1515, such as coprocessors, high-throughput MIC processors, GPGPU's, accelerators (such as, e.g., graphics accelerators or digital signal processing (DSP) units), field programmable gate arrays, or any other processor, are coupled to first bus 1516. In one embodiment, second bus 1520 may be a low pin count (LPC) bus. Various devices may be coupled to a second bus 1520 including, for example, a keyboard and/or mouse 1522, communication devices 1527 and a storage unit 1528 such as a disk drive or other mass storage device which may include instructions/code and data 1530, in one embodiment. Further, an audio I/O 1524 may be coupled to the second bus 1520. Note that other architectures are possible. For example, instead of the point-to-point architecture of FIG. 15, a system may implement a multi-drop bus or other such architecture.

Figure 16:
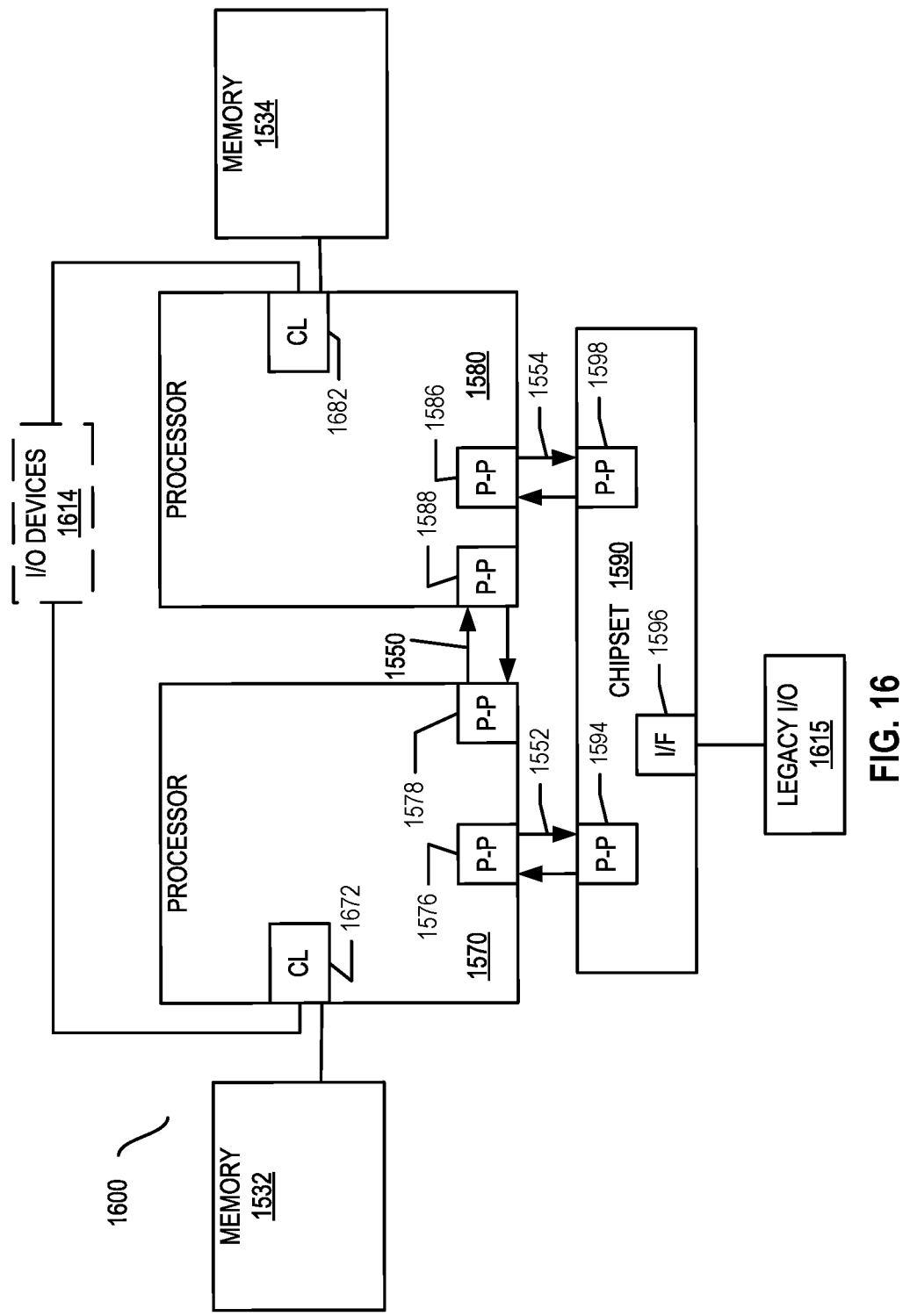

Referring now to FIG. 16, shown is a block diagram of a second more specific exemplary system 1600 in accordance with an embodiment of the present invention. Like elements in FIGS. 15 and 16 bear like reference numerals, and certain aspects of FIG. 15 have been omitted from FIG. 16 in order to avoid obscuring other aspects of FIG. 16.

FIG. 16 illustrates that the processors 1570, 1580 may include integrated memory and I/O control logic ("CL") 1672 and 1682, respectively. Thus, the CL 1672, 1682 include integrated memory controller units and include I/O control logic. FIG. 16 illustrates that not only are the memories 1532, 1534 coupled to the CL 1672, 1682, but also that I/O devices 1614 are also coupled to the control logic 1672, 1682. Legacy I/O devices 1615 are coupled to the chipset 1590.

Figure 17:
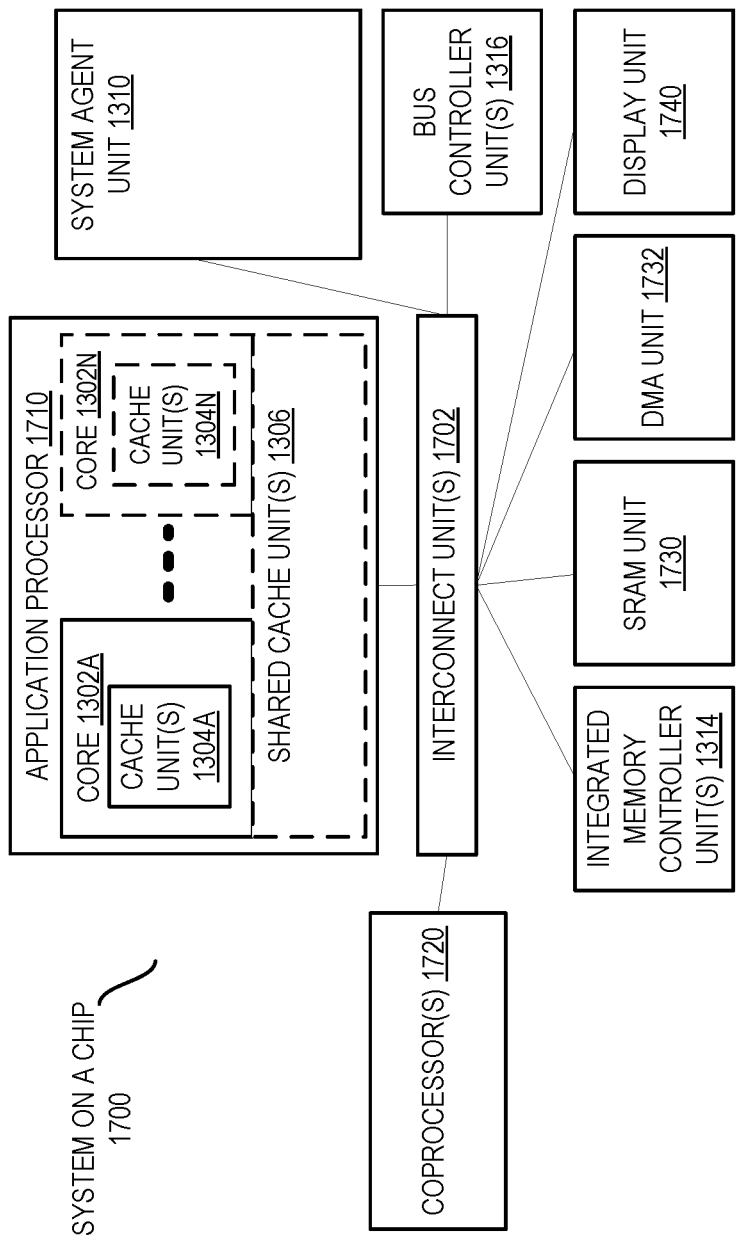

Referring now to FIG. 17, shown is a block diagram of a SoC 1700 in accordance with an embodiment of the present invention. Similar elements in FIG. 13 bear like reference numerals. Also, dashed lined boxes are optional features on more advanced SoCs. In FIG. 17, an interconnect unit(s) 1702 is coupled to: an application processor 1710 which includes a set of one or more cores 1302A-N, which include cache units 1304A-N, and shared cache unit(s) 1306; a system agent unit 1310; a bus controller unit(s) 1316; an integrated memory controller unit(s) 1314; a set of one or more coprocessors 1720 which may include integrated graphics logic, an image processor, an audio processor, and a video processor; an static random access memory (SRAM) unit 1730; a direct memory access (DMA) unit 1732; and a display unit 1740 for coupling to one or more external displays. In one embodiment, the coprocessor(s) 1720 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1530 illustrated in FIG. 15, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 18 is a block diagram contrasting the use of a software instruction converter to convert binary instructions in a source instruction set to binary instructions in a target instruction set according to some embodiments of the invention. In the illustrated embodiment, the instruction converter is a software instruction converter, although alternatively the instruction converter may be implemented in software, firmware, hardware, or various combinations thereof. FIG. 18 shows a program in a high level language 1802 may be compiled using an x86 compiler 1804 to generate x86 binary code 1806 that may be natively executed by a processor with at least one x86 instruction set core 1816. The processor with at least one x86 instruction set core 1816 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1804 represents a compiler that is operable to generate x86 binary code 1806 (e.g., object code) that can, with or without additional linkage processing, be executed on the processor with at least one x86 instruction set core 1816. Similarly, FIG. 18 shows the program in the high level language 1802 may be compiled using an alternative instruction set compiler 1808 to generate alternative instruction set binary code 1810 that may be natively executed by a processor without at least one x86 instruction set core 1814 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1812 is used to convert the x86 binary code 1806 into code that may be natively executed by the processor without an x86 instruction set core 1814. This converted code is not likely to be the same as the alternative instruction set binary code 1810 because an instruction converter capable of this is difficult to make; however, the converted code will accomplish the general operation and be made up of instructions from the alternative instruction set. Thus, the instruction converter 1812 represents software, firmware, hardware, or a combination thereof that, through emulation, simulation, or any other process, allows a processor or other electronic device that does not have an x86 instruction set processor or core to execute the x86 binary code 1806.

FURTHER EXAMPLES

Example 1 provides an exemplary system comprising: a core to generate memory requests; a memory comprising a matrix of storage cells of rows and columns; and a memory controller comprising: a memory request queue (MRQ) to enqueue generated memory requests, a page close timer to close an activated row after passage of a threshold amount of time without any access thereto, and a scheduler to: select a memory request from the MRQ, determine there are memory pending requests to different pages of a same bank of the memory, and send a combined column address strobe (CAS) signal and auto precharge signal (AP) to the memory for the memory request.

Example 2 includes the substance of the exemplary system of Example 1, wherein the page close timer is to be reset upon an access to the activated row.

Example 3 includes the substance of the exemplary system of Example 1, wherein the memory controller, responsive to a memory read request, is to generate a row address strobe (RAS) signal to copy the activated row to a row buffer, and to use a CAS signal to select elements from the row buffer.

Example 4 includes the substance of the exemplary system of Example 1, wherein the memory controller, responsive to a memory write request, is to store write data in a row buffer, generate a row address strobe (RAS) signal to activate a selected row, when another memory request to the selected row is enqueued, generate the CAS signal to select a storage cell in the selected row to which to copy data from the row buffer, otherwise, when another memory request to a same bank but a different row than the selected row is enqueued, generate the combined AP and CAS signal to copy data from the row buffer to selected storage cells of the activated row, and then close the selected row, and, otherwise, generate the CAS signal only to copy data from the row buffer to selected storage cells of the activated row, and defer to the page close timer to close the activated row.

Example 5 includes the substance of the exemplary system of Example 1, further comprising a memory access monitor circuit to monitor instances of memory access to rows having been closed by the page close timer, the threshold amount of time to be increased when the instances exceed a threshold number of instances.

Example 6 includes the substance of the exemplary system of Example 1, wherein the memory further comprises sense amplifiers and a precharge circuit.

Example 7 includes the substance of the exemplary system of Example 1, wherein the memory is synchronized with a processor clock.

Example 8 provides an exemplary method comprising: receiving memory requests; storing the memory requests in a memory request queue (MRQ); selecting a memory request from the MRQ; determining there are pending memory requests to different pages of a same bank of memory; and sending a combined column address strobe (CAS) signal and auto precharge signal to the memory for the memory request.

Example 9 includes the substance of the exemplary method of Example 8, further comprising resetting the page close timer upon an access to the activated row.

Example 10 includes the substance of the exemplary method of Example 8, further comprising, responsive to a memory read request, generating a row address strobe (RAS) signal to copy the activated row to a row buffer, and generating the CAS signal to select elements to read from the row buffer.

Example 11 includes the substance of the exemplary method of Example 8, further comprising, responsive to a memory write request, storing write data in a row buffer, generating a row address strobe (RAS) signal to activate a selected row, when another memory request to the selected row is enqueued, generating the CAS signal to select a storage cell in the selected row to which to copy data from the row buffer, otherwise, when another memory request to a same bank but a different row than the selected row is enqueued, generating the combined AP and CAS signal to copy data from the row buffer to selected storage cells of the activated row, and then close the selected row, and, otherwise, generate the CAS signal only to copy data from the row buffer to selected storage cells of the activated row, and defer to the page close timer to close the activated row.

Example 12 includes the substance of the exemplary method of Example 8, further comprising monitoring instances of memory access to rows having been closed by the page close timer, the threshold amount of time to be increased when the instances exceed a threshold number of instances.

Example 13 includes the substance of the exemplary method of Example 8, wherein the memory further comprises sense amplifiers and a precharge circuit.

Example 14 includes the substance of the exemplary method of Example 8, wherein the memory is either synchronized with a processor clock.

Example 15 provides an exemplary apparatus comprising: a core to generate memory requests; a memory controller comprising: a memory request queue (MRQ) to enqueue generated memory requests, a page close timer to close an activated row after passage of a threshold amount of time without any access thereto, and a scheduler to: select a memory request from the MRQ, determine there are memory pending requests to different pages of a same bank of memory, and send a combined column address strobe (CAS) signal and auto precharge signal (AP) to the memory for the memory request.

Example 16 includes the substance of the exemplary apparatus of Example 15, wherein the page close timer is to be reset upon an access to the activated row.

Example 17 includes the substance of the exemplary apparatus of Example 15, wherein the memory controller, responsive to a memory read request, is to generate a row address strobe (RAS) signal to copy the activated row to a row buffer, and to use a CAS signal to select elements from the row buffer.

Example 18 includes the substance of the exemplary apparatus of Example 15, wherein the memory controller, responsive to a memory write request, is to store write data in a row buffer, generate a row address strobe (RAS) signal to activate a selected row, when another memory request to the selected row is enqueued, generate the CAS signal to select a storage cell in the selected row to which to copy data from the row buffer, otherwise, when another memory request to a same bank but a different row than the selected row is enqueued, generate the combined AP and CAS signal to copy data from the row buffer to selected storage cells of the activated row, and then close the selected row, and, otherwise, generate the CAS signal only to copy data from the row buffer to selected storage cells of the activated row, and defer to the page close timer to close the activated row.

Example 19 includes the substance of the exemplary apparatus of Example 15, further comprising a memory access monitor circuit to monitor instances of memory access to rows having been closed by the page close timer, the threshold amount of time to be increased when the instances exceed a threshold number of instances.

What is claimed is:

1. A system comprising:
   a core to generate memory requests;
   a memory comprising a matrix of storage cells of rows and columns; and
   a memory controller comprising:
   a memory request queue (MRQ) to enqueue generated memory requests,
   a page close timer to close an activated row after passage of a threshold amount of time without any access thereto, and
   a scheduler to:
   select a memory request from the MRQ,
   determine when there is a memory pending request to a different page of a same bank of the memory,
   when there is a memory pending request to a different page of a same bank of the memory, send a combined column address strobe (CAS) signal and auto precharge signal (AP) to the memory for the memory request, and
   when there is not a memory pending request to a different page of a same bank of the memory, send only a CAS signal and allow the page close timer to close the page.

2. The system of claim 1, wherein the page close timer is to be reset upon an access to the activated row.

3. The system of claim 1, wherein the memory controller, responsive to a memory read request, is to generate a row address strobe (RAS) signal to copy the activated row to a row buffer, and to use a CAS signal to select elements from the row buffer.

4. The system of claim 1, wherein the memory controller, responsive to a memory write request, is to store write data in a row buffer, generate a row address strobe (RAS) signal to activate a selected row, when another memory request to the selected row is enqueued, generate the CAS signal to select a storage cell in the selected row to which to copy data from the row buffer, otherwise, when another memory request to a same bank but a different row than the selected row is enqueued, generate the combined AP and CAS signal to copy data from the row buffer to selected storage cells of the activated row, and then close the selected row, and, otherwise, generate the CAS signal only to copy data from the row buffer to selected storage cells of the activated row, and defer to the page close timer to close the activated row.

5. The system of claim 1, further comprising a memory access monitor circuit to monitor instances of memory access to rows having been closed by the page close timer, the threshold amount of time to be increased when the instances exceed a threshold number of instances.

6. The system of claim 1, wherein the memory further comprises sense amplifiers and a precharge circuit.

7. The system of claim 1, wherein the memory is synchronized with a processor clock.

8. A method comprising:
   receiving memory requests;
   storing the memory requests in a memory request queue (MRQ);
   selecting a memory request from the MRQ;
   determining when there is a memory pending request to a different page of a same bank of the memory;
   when there is a memory pending request to a different page] of a same bank of the memory, sending a combined column address strobe (CAS) signal and auto precharge signal to the memory for the memory request; and
   when there is not a memory pending request to a different page of a same bank of the memory, sending only a CAS signal and allow the page close timer to close the page.

9. The method of claim 8, further comprising resetting s page close timer upon an access to the activated row.

10. The method of claim 8, further comprising, responsive to a memory read request, generating a row address strobe (RAS) signal to copy an activated row to a row buffer, and generating the CAS signal to select elements to read from the row buffer.

11. The method of claim 8, further comprising, responsive to a memory write request, storing write data in a row buffer, generating a row address strobe (RAS) signal to activate a selected row, when another memory request to the selected row is enqueued, generating the CAS signal to select a storage cell in the selected row to which to copy data from the row buffer, otherwise, when another memory request to a same bank but a different row than the selected row is enqueued, generating the combined AP and CAS signal to copy data from the row buffer to selected storage cells of the activated row, and then close the selected row, and, otherwise, generate the CAS signal only to copy data from the row buffer to selected storage cells of the activated row, and defer to a page close timer to close the activated row.

12. The method of claim 8, further comprising monitoring instances of memory access to rows having been closed by a page close timer, a threshold amount of time to be increased when the instances exceed a threshold number of instances.

13. The method of claim 8, wherein the memory further comprises sense amplifiers and a precharge circuit.

14. The method of claim 8, wherein the memory is either synchronized with a processor clock.

15. A apparatus comprising:
a core to generate memory requests;
a memory controller comprising:
a memory request queue (MRQ) to enqueue generated memory requests,
a page close timer to close an activated row after passage of a threshold amount of time without any access thereto, and
a scheduler to:
select a memory request from the MRQ,
determine when there is a memory pending request to a different page of a same bank of the memory,
when there is a memory pending request to a different page of a same bank of the memory, send a combined column address strobe (CAS) signal and auto precharge signal (AP) to the memory for the memory request, and
when there is not a memory pending request to a different page of a same bank of the memory, send only a CAS signal and allow the page close timer to close the page.

16. The apparatus of claim 15, wherein the page close timer is to be reset upon an access to the activated row.

17. The apparatus of claim 15, wherein the memory controller, responsive to a memory read request, is to generate a row address strobe (RAS) signal to copy the activated row to a row buffer, and to use a CAS signal to select elements from the row buffer.

18. The apparatus of claim 15, wherein the memory controller, responsive to a memory write request, is to store write data in a row buffer, generate a row address strobe (RAS) signal to activate a selected row, when another memory request to the selected row is enqueued, generate the CAS signal to select a storage cell in the selected row to which to copy data from the row buffer, otherwise, when another memory request to a same bank but a different row than the selected row is enqueued, generate the combined AP and CAS signal to copy data from the row buffer to selected storage cells of the activated row, and then close the selected row, and, otherwise, generate the CAS signal only to copy data from the row buffer to selected storage cells of the activated row, and defer to the page close timer to close the activated row.

19. The apparatus of claim 15, further comprising a memory access monitor circuit to monitor instances of memory access to rows having been closed by the page close timer, the threshold amount of time to be increased when the instances exceed a threshold number of instances.

* * * * *